United States Patent
Luo et al.

(10) Patent No.: US 11,136,662 B2
(45) Date of Patent: Oct. 5, 2021

(54) APPARATUS AND METHOD FOR ADSORBING A MASK, EVAPORATION DEVICE, AND EVAPORATION METHOD

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Chang Luo, Beijing (CN); Jianpeng Wu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 432 days.

(21) Appl. No.: 16/135,816

(22) Filed: Sep. 19, 2018

(65) Prior Publication Data
US 2019/0203337 A1      Jul. 4, 2019

(30) Foreign Application Priority Data
Jan. 3, 2018   (CN) .......................... 201810004706.3

(51) Int. Cl.
*C23C 14/04*    (2006.01)
*C23C 14/24*    (2006.01)
(Continued)

(52) U.S. Cl.
CPC ............ *C23C 14/042* (2013.01); *C23C 14/24* (2013.01); *C23C 14/54* (2013.01); *C23C 16/52* (2013.01);
(Continued)

(58) Field of Classification Search
CPC ....... C23C 14/042; C23C 14/54; C23C 14/24; C23C 16/52; H01L 51/56; H01L 51/0011
(Continued)

(56) References Cited

U.S. PATENT DOCUMENTS

2006/0148114 A1    7/2006  Yotsuya et al.
2010/0273387 A1   10/2010  Inoue et al.
(Continued)

FOREIGN PATENT DOCUMENTS

CN          1800432 A    7/2006
CN        101970707 A    2/2011
(Continued)

OTHER PUBLICATIONS

First Office Action issued in corresponding Chinese Application No. 201810004706.3, dated Jul. 29, 2019, with English translation.

*Primary Examiner* — Dharti H Patel
(74) *Attorney, Agent, or Firm* — McDermott Will & Emery LLP

(57) ABSTRACT

An apparatus for adsorbing a mask includes an adsorbing member and a controller connected to the adsorbing member. The adsorbing member is configured to adsorb the mask during evaporation and is capable of simultaneously producing different or a same adsorption force to different regions of the mask. The controller is configured to control the adsorbing member to start adsorption from at least one initial adsorption region of the mask, and then control the adsorbing member to gradually expand an adsorption range from the at least one initial adsorption region until the mask is entirely attached to a base substrate.

20 Claims, 21 Drawing Sheets

(51) Int. Cl.
*H01L 51/56* (2006.01)
*H01L 51/00* (2006.01)
*C23C 16/52* (2006.01)
*C23C 14/54* (2006.01)

(52) U.S. Cl.
CPC .......... *H01L 51/0011* (2013.01); *H01L 51/56* (2013.01)

(58) Field of Classification Search
USPC ....................................................... 361/234
See application file for complete search history.

(56) References Cited

U.S. PATENT DOCUMENTS

2016/0251747 A1   9/2016   Zhao et al.
2017/0103877 A1*  4/2017   Yokota .............. H01J 37/32091

FOREIGN PATENT DOCUMENTS

CN      103952665 A     7/2014
JP         61-87862 A    5/1986

* cited by examiner

APPARATUS AND METHOD FOR ADSORBING A MASK, EVAPORATION DEVICE, AND EVAPORATION METHOD

CROSS-REFERENCE TO RELATED APPLICATION

This application claims priority to Chinese Patent Application No. 201810004706.3, filed on Jan. 3, 2018, titled "APPARATUS AND METHOD FOR ADSORBING A MASK, EVAPORATION DEVICE, AND EVAPORATION METHOD", which is incorporated herein by reference in its entirety.

TECHNICAL FIELD

The present disclosure relates to the field of organic light-emitting diode (OLED) display panel manufacturing technologies, and in particular, to an apparatus and a method for adsorbing a mask, an evaporation device, and an evaporation method.

BACKGROUND

At present, the production of OLED display panels is mainly by evaporation coating. During the evaporation process, a mask including for example fine metal masks (FMMs) is used to deposit red (R) sub-pixels, green (G) sub-pixels, blue (B) sub-pixels and other film layers to ensure that the film material is evaporated at predetermined positions.

SUMMARY

Some embodiments of the present disclosure provide an apparatus for adsorbing a mask. The apparatus comprises an adsorbing member and a controller connected to the adsorbing member. The adsorbing member is configured to adsorb the mask during evaporation and is capable of simultaneously producing different or a same adsorption force to different regions of the mask. The controller is configured to control the adsorbing member to start adsorption from at least one initial adsorption region of the mask, and then control the adsorbing member to gradually expand an adsorption range from the at least one initial adsorption region until the mask is entirely attached to a base substrate.

In some embodiments, the adsorbing member comprises a first carrier board, at least two electromagnets, and at least two switches. The at least two electromagnets are dispersedly disposed on the first carrier board, and are capable of simultaneously generating a same magnetic force. Each of the at least two electromagnets comprises an iron core and a coil of multiple turns of wire wound around the iron core. Each of the at least two switches is connected to at least one of the at least two electromagnets.

In some embodiments, the adsorbing member further comprises at least two variable resistors, and each of the at least two variable resistors is connected to at least one of the at least two electromagnets.

In some embodiments, the at least two electromagnets, the at least two switches, and the at least two variable resistors are connected in series in one-to-one correspondence to form a plurality of branches that are connected in parallel.

In some embodiments, the iron core is a cylinder, and the at least two electromagnets are vertically arranged on the first carrier board in an array, or vertically arranged on the first carrier board in at least two concentric rings. Alternatively, the iron core is a square cylinder, and the at least two electromagnets are horizontally arranged on the first carrier board in an array.

In some embodiments, a gap between two adjacent electromagnets of the at least two electromagnets is less than or equal to a width of a region of the mask where wrinkles are expected to be generated. The iron core is a cylinder having a diameter less than or equal to the width of the region of the mask where wrinkles are expected to be generated. Alternatively, the iron core is a square cylinder having a width less than or equal to the width of the region of the mask where wrinkles are expected to be generated.

In some embodiments, the adsorbing member comprises a flexible second carrier board, and at least two magnets dispersedly disposed on the second carrier board. The at least two magnets are capable of simultaneously generating a same magnetic force.

In some embodiments, the adsorbing member further comprises a rigid flat plate configured to be placed between the second carrier board and the base substrate during adsorption of the mask to support the second carrier board.

In some embodiments, the adsorbing member comprises at least two Gauss units, and each of the at least two Gauss units comprises a third carrier board and at least one magnet disposed on the third carrier board. The at least two Gauss units are able to be lifted and lowered independently, and are capable of simultaneously generating a same magnetic force.

Some embodiments of the present disclosure provide a method for adsorbing a mask for use in the apparatus for adsorbing the mask provided by the embodiments of the present disclosure. The method comprises: starting adsorption from at least one initial adsorption region of the mask, and then gradually expanding an adsorption range from the at least one initial adsorption region until the mask is entirely attached to the base substrate.

In some embodiments, the adsorbing member of the apparatus for adsorbing the mask comprises a first carrier board, at least two electromagnets, and at least two switches. The at least one initial adsorption region is a central region of the mask or comprises central regions of FMMs of the mask, and the method comprises: turning on the at least two electromagnets in order in directions outwardly radiating from the at least one initial adsorption region.

Alternatively, the at least one initial adsorption region is a bisector region of the mask or comprises bisector regions of FMMs of the mask, and the method comprises: turning on the at least two electromagnets in order from the initial adsorption region to both sides of the mask or both sides of each FMM of the mask in directions perpendicular to the initial adsorption region. The bisector region is parallel to a length direction of the FMMs or perpendicular to the length direction of the FMMs.

Alternatively, the at least one initial adsorption region is an edge region on one side of the mask or comprises edge regions each of which is disposed on one side of a corresponding FMM of the mask, and the method comprises: turning on the at least two electromagnets in order from the at least one initial adsorption region to another side of the mask or another sides of the FMMs of the mask in directions perpendicular to the initial adsorption region.

In some embodiments, the adsorbing member of the apparatus for adsorbing the mask comprises a flexible second carrier board and at least two magnets. The at least one initial adsorption region is a bisector region of the mask, and the method comprises: clamping two ends of the second carrier board to cause the second carrier board to sag naturally in a U-shape and cause a sagging portion of the second carrier board to face the at least one initial adsorption region; controlling the second carrier board to gradually descend; and then controlling the two ends of the second carrier board to be gradually lowered until the second carrier board is entirely in a horizontal state. The bisector region is parallel to a length direction of FMMs or perpendicular to the length direction of the FMMs.

Alternatively, the at least one initial adsorption region is an edge region on one side of the mask, and the method comprises: clamping two ends of the second carrier board to cause the second carrier board to be inclined and cause a lower end of the second carrier board to face the at least one initial adsorption region; controlling the second carrier board to gradually descend; and then controlling a higher end of the second carrier board to be gradually lowered, until the second carrier board is entirely in a horizontal state.

Alternatively, the at least one initial adsorption region is a central region of the mask, and the method comprises: clamping four sides of the second carrier board to cause the second carrier board to sag naturally in a bowl shape and cause a sagging portion of the second carrier board to face the at least one initial adsorption region; controlling the second carrier board to gradually descend; and then controlling the clamped four sides of the second carrier board to be gradually lowered until the second carrier board is entirely in a horizontal state.

In some embodiments, the adsorbing member of the apparatus for adsorbing the mask comprises at least two Gauss units. The at least one initial adsorption region is a central region of the mask or comprises central regions of FMMs of the mask, and the method comprises: controlling the at least two Gauss units to descend in order in directions outwardly radiating from the at least one initial adsorption region, until all of the at least two Gauss units are on a same horizontal plane.

Alternatively, the at least one initial adsorption region is a bisector region of the mask or comprises bisector regions of FMMs of the mask, and the method comprises: controlling the at least two Gauss units to descend in order from the initial adsorption region to both sides of the mask or both sides of each FMM of the mask in directions perpendicular to the initial adsorption region, until all of the at least two Gauss units are on the same horizontal plane. The bisector region is parallel to a length direction of the FMMs or perpendicular to a length direction of the FMMs.

Alternatively, the at least one initial adsorption region is an edge region on one side of the mask or comprises edge regions each of which is disposed on one side of a corresponding FMM of the mask, and the method comprises: controlling the at least two Gauss units to descend in order from the at least one initial adsorption region to another side of the mask or another sides of FMMs of the mask in directions perpendicular to the initial adsorption region, until all of the Gauss units are on the same horizontal plane.

In some embodiments, the adsorbing member of the apparatus for adsorbing the mask comprises a rigid Gaussian plate having a uniform magnetic force. The at least one initial adsorption region is an edge region on one side of the mask, and the method comprises: clamping two ends of the rigid Gaussian plate to cause the rigid Gaussian plate to be inclined and cause a lower end of the rigid Gaussian plate to face the at least one initial adsorption region; controlling the rigid Gaussian plate to gradually descend; and then controlling a higher end of the rigid Gaussian plate to be gradually lowered, until the rigid Gaussian plate is in a horizontal state.

Some embodiments of the present disclosure provide an evaporation device comprising the apparatus for adsorbing the mask provided by the embodiments of the present disclosure.

Some embodiments of the present disclosure provide an evaporation method, which comprises: adsorbing a mask using the method for adsorbing the mask provided by the embodiments of the present disclosure to attach the mask to the base substrate.

Some embodiments of the present disclosure provide an FMM in which a thickness of a region where wrinkles are expected to be generated is greater than a thickness of remaining regions.

In some embodiments, a pattern having a certain thickness is provided in the region where wrinkles are expected to be generated.

In some embodiments, the region where wrinkles are expected to be generated is located in a non-display area of the FMM.

Some embodiments of the present disclosure provide a mask, which comprises at least one FMM provided by the embodiments of the present disclosure.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

In order to make the above objectives, features and advantages more understandable, the technical solutions in embodiments of the present disclosure will be described clearly and completely with reference to the accompanying drawings in embodiments of the present disclosure. Obviously, the described embodiments are merely some but not all of embodiments of the present disclosure. All other embodiments obtained on the basis of the embodiments of the present disclosure by a person of ordinary skill in the art without paying any creative effort shall be included in the protection scope of the present disclosure.

In an OLED display panel, R, G and B sub-pixel film layers are deposited by using a mask including for example FMMs. FIGS. 1a-1d show a basic fabrication process of a mask including such FMMs in the related art. The fabrication process includes: sequentially welding covers 2, howlings 3 and strip-shaped FMMs 4 on a metal frame 1 to form a mask. A length direction of each of the covers 2 is consistent with a length direction of the FMMs 4, and one of the covers 2 is located in a gap between two adjacent FMMs 4 to block the gap between the two adjacent FMMs. A length direction of each of the howlings 3 is perpendicular to the length direction of the FMMs, and the howlings are configured to support the FMMs 4. An orthographic projection of each of mesh regions formed by intersection of the covers 2 and the howlings 3 on a plane defined by the metal frame 1 covers an orthographic projection of a corresponding display area AA of the FMMs 4 on the plane defined by the metal frame 1, and the display area AA of the FMMs 4 corresponds to a display area AA of the display panel.

Figure 1A:
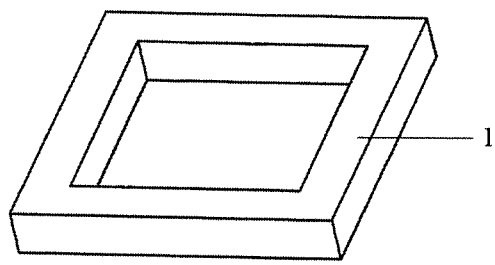
FIGS. 1a-1d are diagrams showing a tensioning method of FMMs in the related art.
Figure 1B:
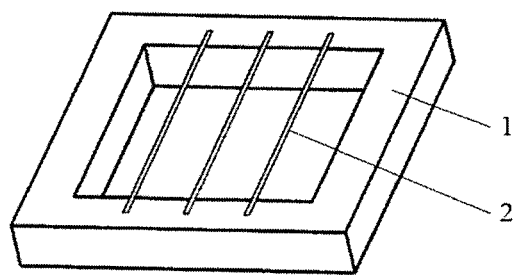
Figure 1C:
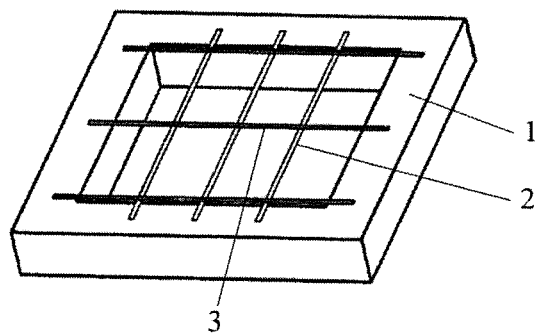
Figure 1D:
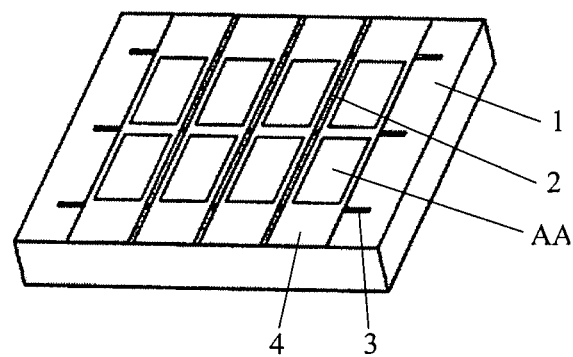
Figure 2A:
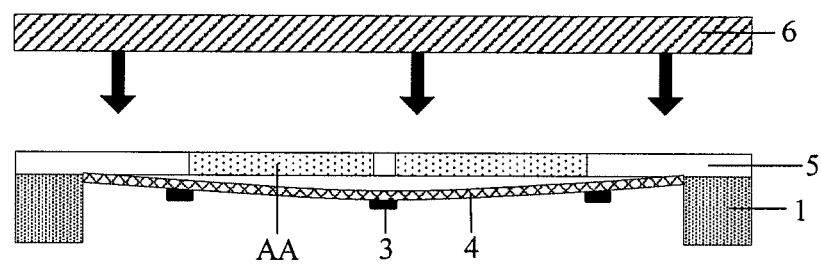
FIGS. 2a-2b are state diagrams of a process in which a mask is adsorbed in the related art.
Figure 2B:
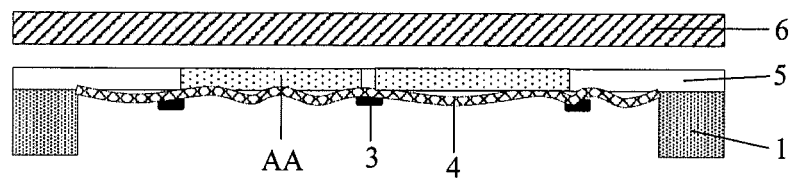

FIGS. 2a-2b show a basic process of evaporation using a mask including for example FMMs in the related art. The process includes: placing a base substrate 5 over the mask during evaporation, and attaching the base substrate to the FMMs 4 of the mask. Generally, the mask and the base substrate 5 will sag due to their own gravity, and there may be a gap between the two. Therefore, it is necessary to place a ferromagnetic Gaussian plate 6 above the base substrate 5 to adsorb the mask. Thereby, the FMMs 4 are more closely attached to the base substrate 5 to ensure an accuracy of an evaporation position.

However, after the mask is adsorbed, the FMMs 4 are liable to wrinkle, which causes a shift in the evaporation position and affects a display panel yield. In severe cases, the FMMs 4 crease, and even pore structures of the FMMs 4 are destroyed, which will directly lead to damage or scrapping of the entire mask, resulting in cost loss.

Regarding the above problem, the inventors of the present disclosure have found the main causes of such problem through research, which are listed as follows. With continued reference to FIGS. 2a-2b, the Gaussian plate 6 in the related art is formed by inlaying strip-shaped permanent magnets in a certain arrangement on a rigid flat plate, so that the Gaussian plate 6 may generate a relatively uniform magnetic force (adsorption force) to a lower region. However, this design has the following problems in actual production.

Since there is a gap between two adjacent strip-shaped permanent magnets, the adsorption force of the Gaussian plate 6 to the lower region is not absolutely uniform. Since different parts of the mask have different structures, and the relative positions of the different parts of the mask and the base substrate 5 are different, when the mask is subjected to an upward adsorption force, a portion of the FMM 4 is adsorbed upward first and attached to the base substrate 5. Thus, remaining portions of the FMM 4 are subjected to pressing stress of their respective surrounding area and may not be attached to the base substrate 5, thereby generating wrinkles.

When the covers 2 and the howlings 3 are adsorbed by the Gaussian plate 6, the covers 2 and the howlings 3 will cause surrounding FMMs 4 to be squeezed. As a result, wrinkles of the FMMs 4 cannot pass across positions of the covers 2 and the howlings 3, thereby finally forming wrinkles.

When wrinkles are generated on the FMM 4, if the Gaussian plate 6 is further close to the mask, an adsorption force to the FMM 4 is increased, causing an imbalance in internal stress and magnetic force in the FMM 4. As a result, a corresponding portion of the FMM 4 is creased, or a pore structure of the FMM 4 is destroyed, causing the entire mask to be damaged or scrapped.

Regarding the above problems, some embodiments of the present disclosure provide an apparatus for adsorbing a mask. The apparatus includes an adsorbing member and a controller connected to the adsorbing member. The adsorbing member is configured to adsorb the mask during evaporation and is capable of simultaneously producing different or a same adsorption force to different regions of the mask. The controller is configured to control the adsorbing member to start adsorption from at least one initial adsorption region of the mask, and then control the adsorbing member to gradually expand an adsorption range from the at least one initial adsorption region until the mask is entirely attached to a base substrate.

In the foregoing apparatus, in the process of adsorbing the mask, the adsorbing member simultaneously generates different adsorption force to different regions of the mask, and the adsorbing member is controlled by the controller to start adsorption from the at least one initial adsorption region, and then gradually expand an adsorption range. After the entire mask is attached to the base substrate, the adsorbing member simultaneously generates the same adsorption force to each region of the mask, and the adsorbing member may uniformly adsorb respective regions of the mask.

Some embodiments of the present disclosure provide a method for adsorbing a mask, which is applied to the above apparatus. The method includes: starting adsorption from at least one initial adsorption region of the mask, and then gradually expanding an adsorption range from the at least one initial adsorption region until the mask is entirely attached to the base substrate.

In the apparatus and method for adsorbing the mask provided by the embodiments of the present disclosure, during the process of adsorbing the mask, adsorption is started from at least one initial adsorption region of the mask, and then the adsorption range is gradually expanded from the at least one initial adsorption region until the entire mask is attached to the base substrate. In this way, the problem that the entire mask is magnetically adsorbed by the Gaussian plate at the same time may be avoided, and wrinkles on the FMMs of the mask may be reduced.

In addition, in some embodiments, a key area of the FMM (the key area is for example a display area of the FMM) to be adsorbed first. In this way, wrinkles to be generated on the FMM may be moved outside the key area, thereby preventing wrinkles from being generated on the key area of the FMM. Consequently, an offset of an evaporation position caused by wrinkling of the FMM is avoided; a color mixing problem of the display panel caused by deposition of evaporation materials outside a sub-pixel opening is effectively solved; and a yield of OLED display panel is improved. Moreover, since the wrinkles on the FMM is reduced, there won't be creases on the FMM, and the pore structure of the FMM will not be damaged. As a result, damage or scrapping of the mask is avoided, and unnecessary waste of costs is avoided.

The apparatus and method for adsorbing a mask will be exemplified below.

Some embodiments of the present disclosure provide an apparatus for adsorbing a mask. As shown in FIGS. 3a-3b and 5a-5d, the apparatus includes an adsorbing member 100 and a controller 200. The adsorbing member 100 includes a first carrier board 11, at least two electromagnets 7 dispersedly disposed on the first carrier board 11, and at least two switches 8.

The first carrier board 11 is configured to carry the at least two electromagnets 7. In some examples, the first carrier board 11 is a rigid flat panel.

Figure 3A:
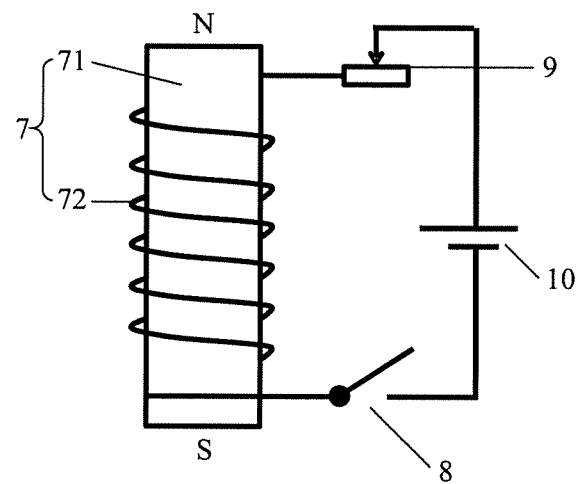
FIG. 3a is a diagram of a first control circuit of an electromagnet according to some embodiments of the present disclosure.

In some examples, the at least two electromagnets 7 are inlaid on the first carrier board 11. Alternatively, the at least two electromagnets 7 are directly mounted on the first carrier board 11. Each of the at least two electromagnets 7 is capable of generating a magnetic force when turned on, and the at least two electromagnets 7 are capable of simultaneously generating the same magnetic force, so that the at least two electromagnets are capable of generating a relatively uniform adsorption force for the mask 300 when adsorbing the entire mask 300. In some embodiments, as shown in FIG. 3a, each of the at least two electromagnets 7 includes an iron core 71, and a coil 72 wound on the iron core 71. When the coil 72 is energized, the iron core 71 can generate magnetism due to electromagnetic action. At this time, the electromagnet 7 is similar to a permanent magnet and has two poles of N and S. A magnitude of the magnetic force generated by the electromagnet 7 is related to a number of turns of the energized coil 72, a magnitude of the current, and a cross-sectional area of the iron core 71. In order to supply power to the coil 72 of the electromagnet 7, the coil 72 is connected to a power source 10. In some examples, the coils 72 of the at least two electromagnets 7 are connected to the same power source 10. Of course, the coils 72 of the at least two electromagnets 7 may also be connected to different power sources.

In some embodiments, each of the switches 8 is connected to at least one electromagnet 7 of the adsorbing member 100 for controlling on and off states of the at least one electromagnet 7, so as to achieve control of the magnetic force in the corresponding region. In some examples, as shown in FIG. 3a, each of the switches 8 is connected to a corresponding electromagnet 7 of the adsorbing member 100, so that each electromagnet 7 may be independently controlled. In some other embodiments, the at least two electromagnets 7 include a plurality of electromagnets, and one switch 8 is connected to at least two electromagnets of the plurality of electromagnets 7, so as to uniformly control the electromagnets 7. In this way, the control process is simpler and the number of switches 8 is relatively small. The switch 8 is disposed, for example, on the electromagnet 7, or on a periphery of the electromagnet 7. For example, the switch 8 is disposed on the first carrier board 11, or in the controller 200.

In the adsorbing member 100 of the above apparatus, permanent magnets of a conventional Gaussian plate are changed to electromagnets 7, so that the switch 8 may be provided to control on and off states of a corresponding electromagnet 7. That is, the switch 8 controls whether the corresponding electromagnet 7 generates a magnetic force, and thus control whether a magnetic force is generated in a corresponding region. With continued reference to FIGS. 5a-5d, when using the adsorbing member 100 to adsorb the mask 300, the controller 200 controls a switch corresponding to electromagnets 7 of the at least two electromagnets 7 in a specific region to be closed so as to turn on the electromagnets 7 in the specific region, so that a magnetic force is generated in the specific region, and a corresponding region of the mask is adsorbed. Then, the controller 200 controls electromagnets 7 of the at least two electromagnets 7 around the specific region to be gradually turned on, so as to gradually adsorb the mask 300, until the mask 300 is entirely adsorbed and attached to the base substrate 5. Since the mask is gradually adsorbed from one part to the whole, there will be fewer or no wrinkles on the FMM 4 of the mask 300. Even if there are wrinkles, the wrinkles may be moved to a non-key area of the FMM 4, such as a non-display area of the FMM 4, so as to avoid display defects caused by wrinkling in the display area AA of the FMM 4.

Figure 3B:
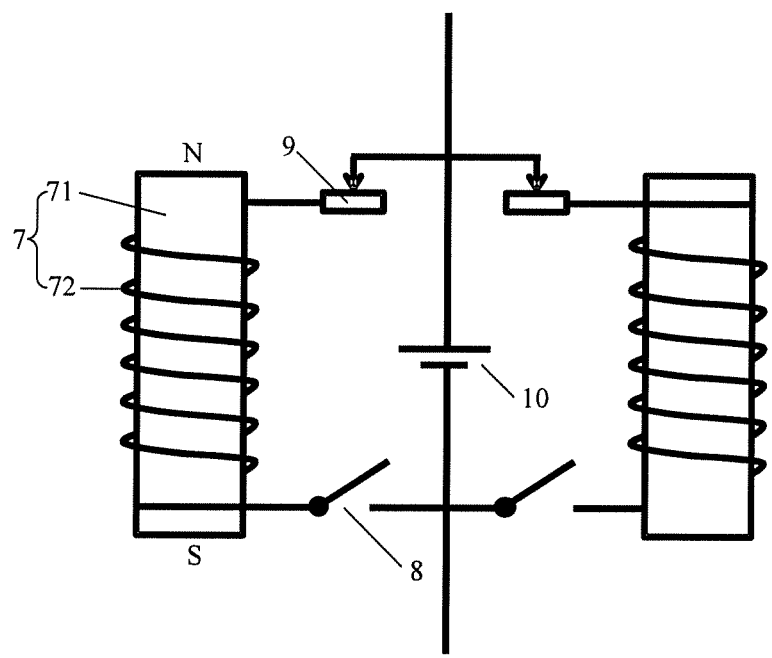
FIG. 3b is a diagram of a second control circuit of an electromagnet according to some embodiments of the present disclosure.

With continued reference to FIG. 3a, optionally, the adsorbing member 100 further includes at least two variable resistors 9, and each variable resistor 9 is connected to at least one electromagnet 7 of the adsorbing member 100. By adjusting a resistance of the variable resistor 9, a magnitude of a current flowing into the coil 72 of each of the at least one electromagnet 7 may be adjusted, therefore a magnitude of a magnetic force generated by each of the at least one electromagnet 7 may be adjusted. In some examples, as shown in FIG. 3b, each variable resistor 9 is connected to a corresponding electromagnet 7 of the adsorbing member 100, so that the magnitude of the magnetic force generated by the electromagnet 7 may be independently controlled. In some other embodiments, the at least two electromagnets 7 includes a plurality of electromagnets 7, and each variable resistor 9 is connected to at least two of the plurality of electromagnets 7, so as to uniformly control the magnitude of the magnetic force generated by the electromagnets 7. In this way, the control process is simpler and the number of variable resistors 9 is relatively small. The variable resistors 9 are disposed, for example, on a periphery of the electromagnets. For example, the variable resistors 9 are disposed on the first carrier board 11, or in the controller 200.

In some embodiments, as shown in FIG. 3b, the at least two electromagnets 7, the at least two switches 8, and the at least two variable resistors 9 are connected in series in one-to-one correspondence to form a plurality of branches that are connected in parallel. In this way, the plurality of branches may share the same power source 10, thereby reducing the number of power sources. Moreover, the branches are independent of each other and do not affect each other.

In the adsorbing member 100, an arrangement of the at least two electromagnets 7 may be determined based on actual needs. The at least two electromagnets 7 are arranged on the first carrier board 11 according to a predetermined rule. The "predetermined rule" referred to herein depends on a desired adsorption force for each region of the mask 300. In some embodiments, a certain region of the mask 300 requires a stronger adsorption force relative to other regions, which may be achieved by increasing a density of electromagnets 7 in the adsorbing member 100 corresponding to the region. In some other embodiments, the at least two electromagnets 7 are uniformly disposed on the first carrier board 11, so that the adsorbing member 100 may generate a relatively uniform magnetic force.

Figure 4A:
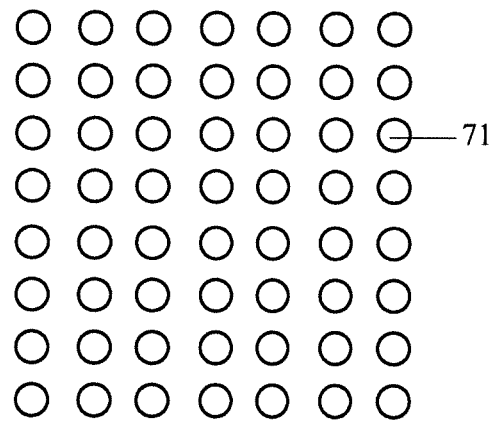
FIG. 4a is a diagram of a first arrangement of electromagnets according to some embodiments of the present disclosure.
Figure 4B:
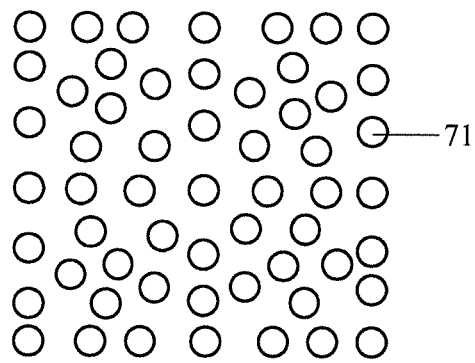
FIG. 4b is a diagram of a second arrangement of electromagnets according to some embodiments of the present disclosure.

In some embodiments, as shown in FIG. 4a, the iron core 71 of each of the at least two electromagnets 7 is a cylinder, and the at least two electromagnets 7 are vertically arranged on the first carrier board 11 in an array. In some other embodiments, as shown in FIG. 4b, the at least two electromagnets 7 are vertically arranged on the first carrier board 11 in at least two concentric rings. In some other embodiments, the electromagnets 7 are arranged according to other predetermined rules, and are horizontally arranged.

Figure 4C:
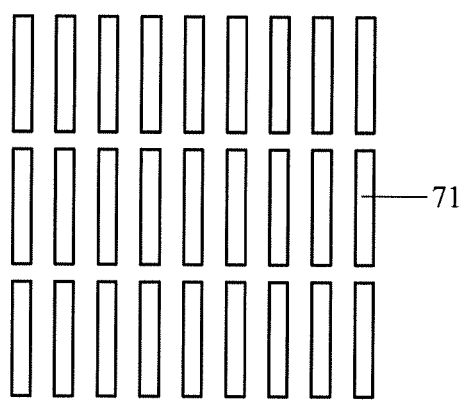
FIG. 4c is a diagram of a third arrangement of electromagnets according to some embodiments of the present disclosure.
Figure 5A:
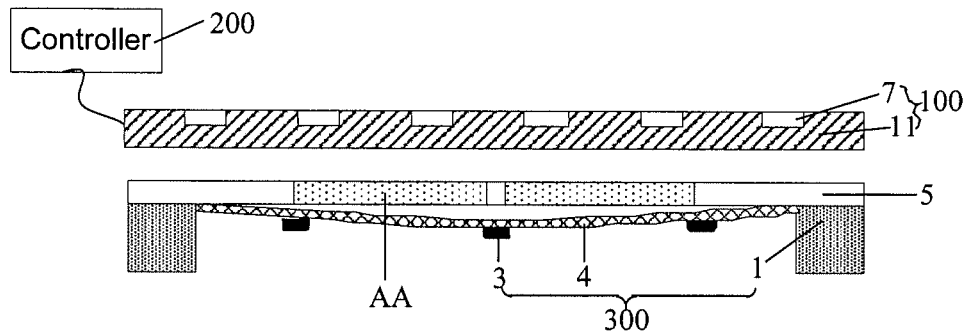
FIGS. 5a-5d are diagrams showing a process in which a mask is adsorbed according to some embodiments of the present disclosure.
Figure 5B:
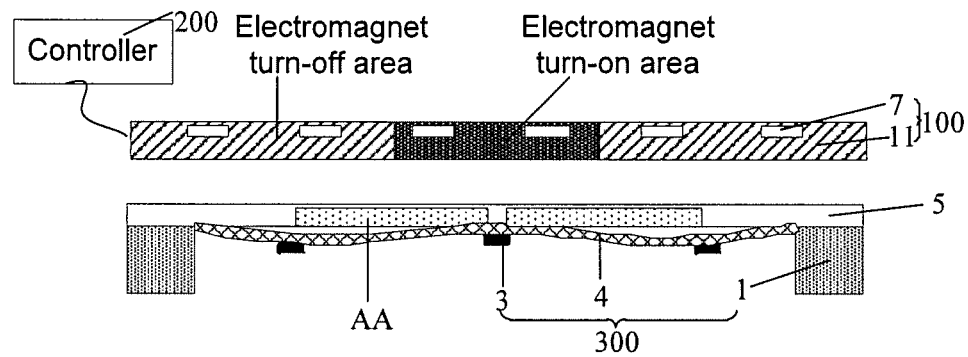
Figure 5C:
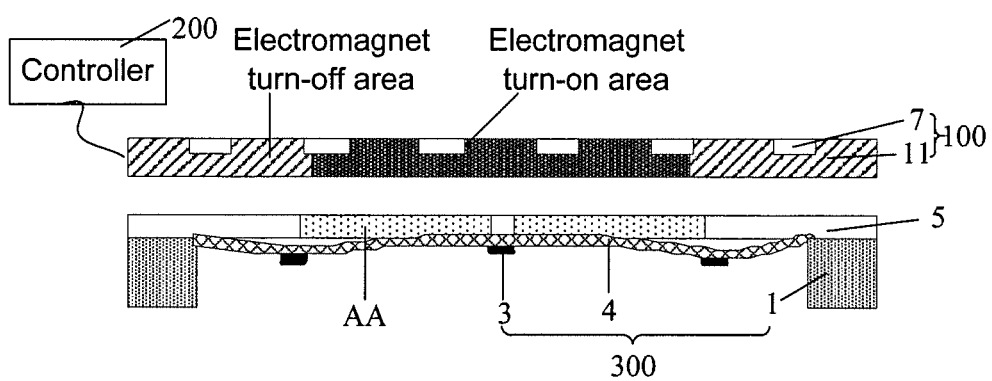
Figure 5D:
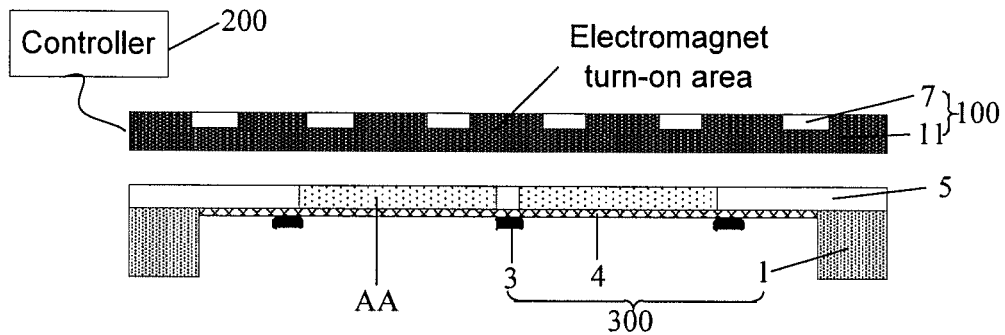

In some other embodiments, as shown in FIG. 4c, the iron core 71 of each of the at least two electromagnets 7 is a square cylinder, and the at least two electromagnets 7 are horizontally arranged on the first carrier board 11 in an array. In some embodiments, the electromagnets 7 are also arranged according to other predetermined rules, and are horizontally arranged.

It will be noted that "in an array" means that the electromagnets are arranged in a plurality of rows and a plurality of columns. The so-called "vertically arranged" means that one of two end faces of the iron core 71 is in contact with the first carrier board 11, and a central axis of the iron core 71 is perpendicular to the first carrier board 11. The so-called "horizontally arranged" means that a portion of an outer peripheral surface of the iron core 71 is in contact with the first carrier board 11, and the central axis of the iron core 71 is parallel to the first carrier board 11.

Since the adsorption is started from at least one initial adsorption region of the mask 300, and then the adsorption range is gradually expanded from the at least one initial adsorption region during the process of adsorbing the mask 300, a region where wrinkles will be generated in the mask 300 and widths of the wrinkles can be estimated. The wrinkles may be generated in a last region of the mask 300 to be attached to the base substrate 5, and the width of the wrinkles is related to factors such as an expansion speed of the adsorption range and an adsorption strength. Based on this conclusion, in some embodiments, a gap between two adjacent electromagnets 7 is less than or equal to a width of a region in the mask 300 where wrinkles are expected to be generated, so as to avoid wrinkling. Moreover, a size of the iron core 71 of the electromagnet 7 may be designed according to the width of the region in the mask 300 where wrinkles are expected to be generated. In some examples, the iron core 71 of the electromagnet 7 is a cylinder having a diameter less than or equal to the width of the region in the mask 300 where wrinkles are expected to be generated. In some other examples, the iron core 71 of the electromagnet 7 is a square cylinder, and a width of the iron core 71 is less than or equal to the width of the region in the mask 300 where wrinkles are expected to be generated, so as to avoid wrinkling. In some embodiments, the size of the iron core 71 of the electromagnet 7 is smaller than the width of the region in the mask 300 where wrinkles are expected to be generated, and an action range of a magnetic force generated by a single electromagnet 7 is smaller than the width of the region in the mask 300 where wrinkles are expected to be generated. Therefore, the adsorbing member 100 may more accurately control a deformation of the mask 300, and thus a position in the mask 300 where wrinkles are expected to be generated may be changed, so that wrinkles do not appear in a region of the FMM 4 having a pore structure in the mask 300.

Based on the apparatus for adsorbing the mask provided by the above embodiments, a method for adsorbing a mask using the apparatus will be exemplarily described below.

Figure 6A:
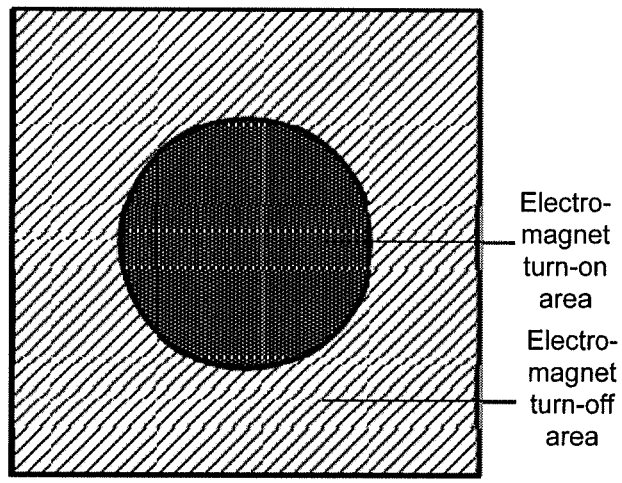
FIGS. 6a-6c are diagrams showing a first method for adsorbing a mask according to some embodiments of the present disclosure.
Figure 6B:
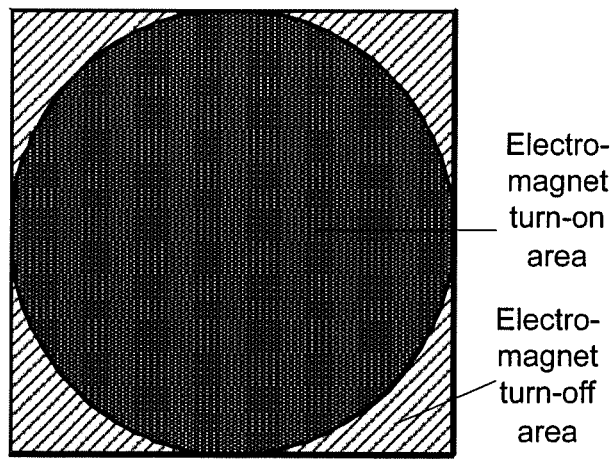
Figure 6C:
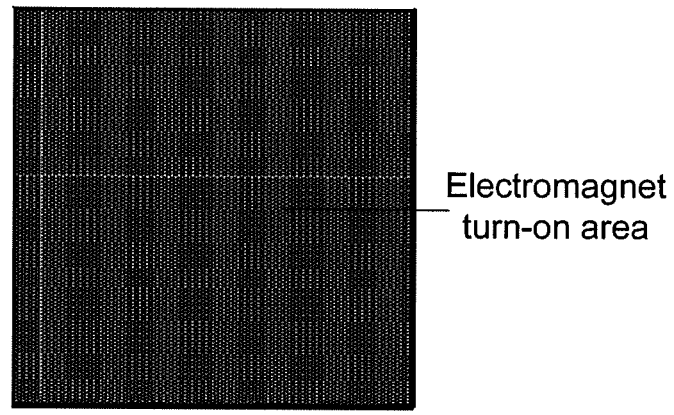

In some embodiments, as shown in FIGS. 6a-6c, the at least one initial adsorption region is a central region of the mask 300, and the method includes: turning on the at least two electromagnets 7 in order in directions outwardly radiating from the initial adsorption region, until the mask 300 is entirely adsorbed and attached to the base substrate 5. At this time, the at least two electromagnets 7 generate the same magnetic force, and apply uniform adsorption force to respective regions of the mask 300. This method can be matched with the adsorbing member 100 adopting the arrangement of electromagnets 7 as shown in FIG. 4b, so as to achieve more precise control of the magnetic force of the adsorbing member 100.

Figure 7A:
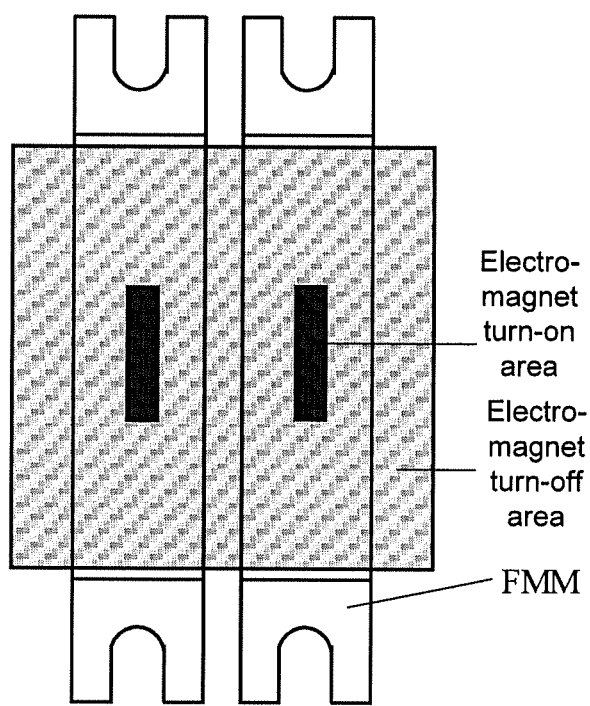
FIGS. 7a-7c are diagrams showing a second method for adsorbing a mask according to some embodiments of the present disclosure.
Figure 7B:
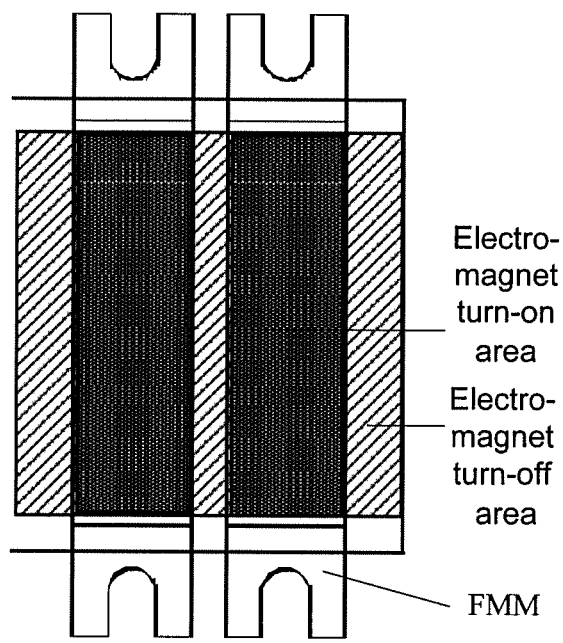
Figure 7C:
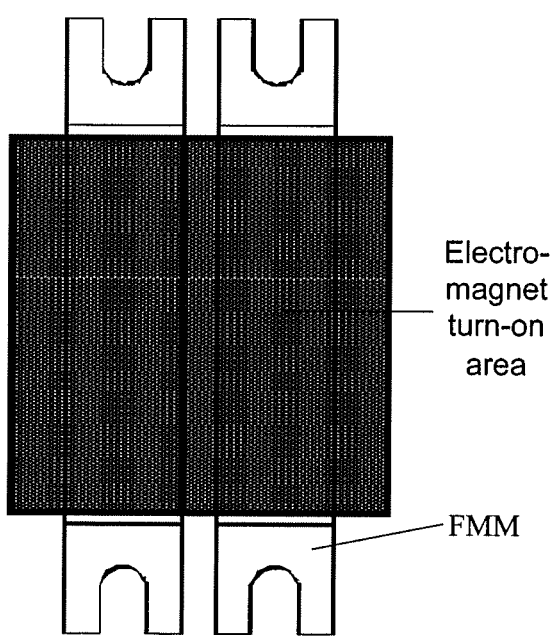

In some other embodiments, as shown in FIGS. 7a-7c, the at least one initial adsorption region includes central regions of FMMs 4 of the mask 300. The method is similar to the method as shown in FIGS. 6a-6c, and therefore it will not be repeated herein.

It will be noted that the term "central region" used in the embodiments of the present disclosure refers to a center point and a region around it, and is not limited to a circular region. The central region is for example a rectangular region or a region of other shapes.

Figure 8A:
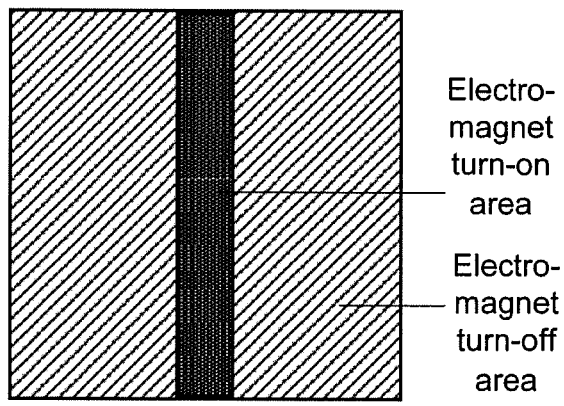
FIGS. 8a-8c are diagrams showing a third method for adsorbing a mask according to some embodiments of the present disclosure.
Figure 8B:
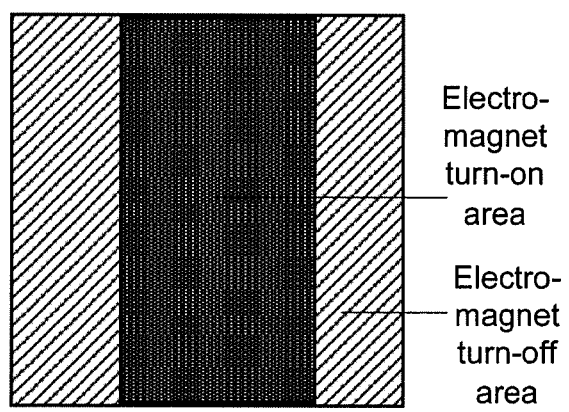
Figure 8C:
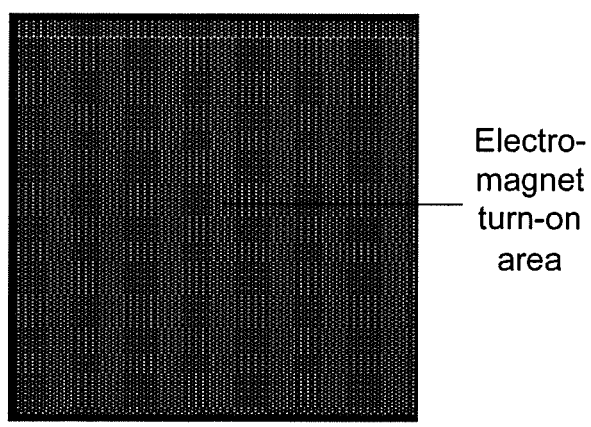

In yet some other embodiments, as shown in FIGS. 8a-8c, the at least one initial adsorption region is a bisector region of the mask 300, and the method includes: turning on the at least two electromagnets 7 in order from the initial adsorption region to both sides of the mask in directions perpendicular to the initial adsorption region, until the mask 300 is entirely adsorbed and attached to the base substrate 5. At this time, the at least two electromagnets 7 generate the same magnetic force, and apply uniform adsorption force to respective regions of the mask 300.

Figure 9A:
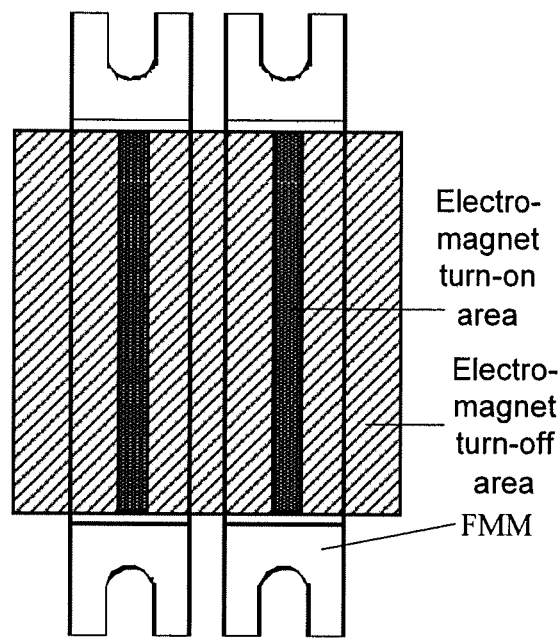
FIGS. 9a-9c are diagrams showing a fourth method for adsorbing a mask according to some embodiments of the present disclosure.
Figure 9B:
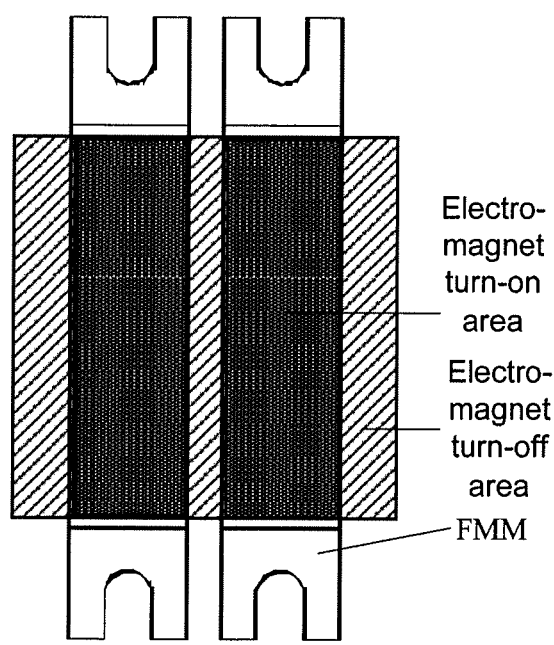
Figure 9C:
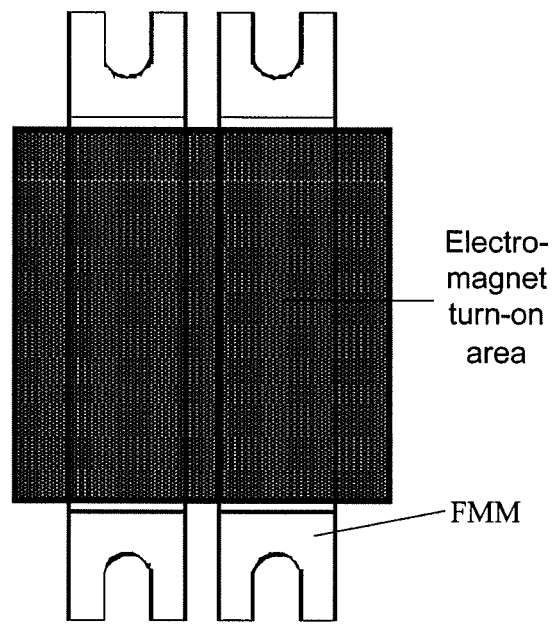

In yet some other embodiments, as shown in FIGS. 9a-9c, the at least one initial adsorption region includes bisector regions of FMMs 4 of the mask 300. The method is similar to the method as shown in FIGS. 8a-8c, and therefore it will not be repeated herein.

It will be noted that the term "bisector region" used in the embodiments of the present disclosure refers to a bisector and its surrounding region.

Furthermore, the "bisector region" described in various embodiments of the present disclosure is, for example, parallel to a length direction of the FMM 4, or perpendicular to the length direction of the FMM. For example, the bisector region shown in FIGS. 8a-8c and 9a-9c are parallel to the length direction of the FMM 4.

Figure 10A:
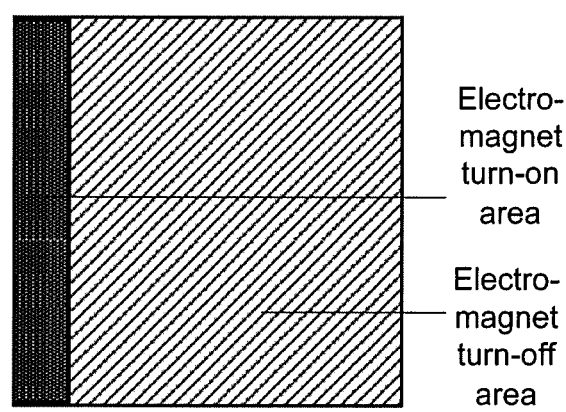
FIGS. 10a-10c are diagrams showing a fifth method for adsorbing a mask according to some embodiments of the present disclosure.
Figure 10B:
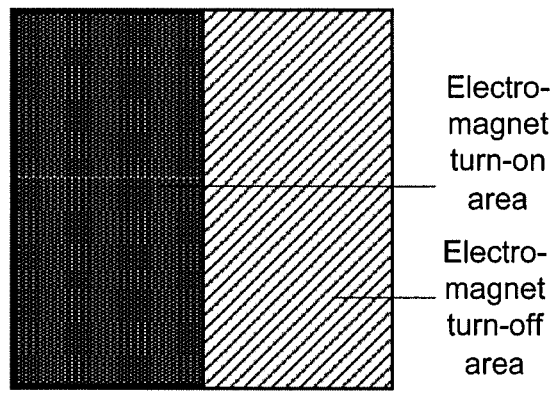
Figure 10C:
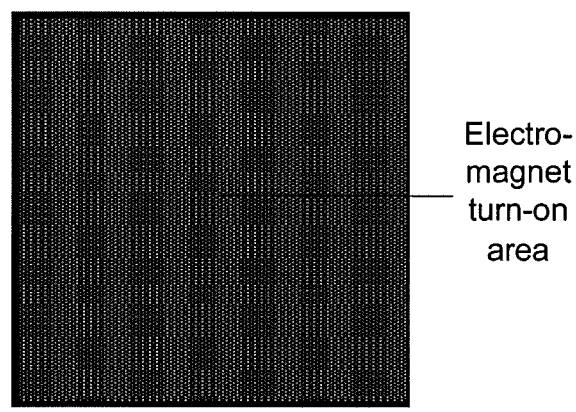

In yet some other embodiments, as shown in FIGS. 10a-10c, the at least one initial adsorption region is an edge region on one side of the mask 300, and the method includes: turning on the electromagnets 7 in order from the initial adsorption region to another side of the mask in directions perpendicular to the initial adsorption region, until the mask 300 is entirely adsorbed and attached to the base substrate 5. At this time, the at least two electromagnets 7 generate the same magnetic force, and apply uniform adsorption force to respective regions of the entire mask 300.

Figure 11A:
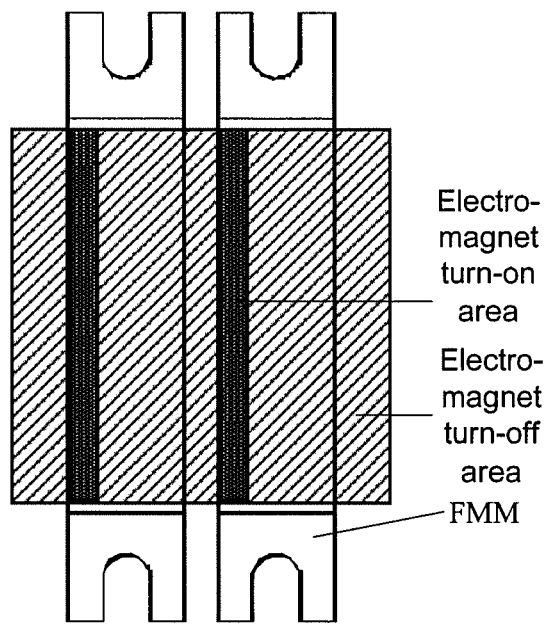
FIGS. 11a-11c are diagrams showing a sixth method for adsorbing a mask according to some embodiments of the present disclosure.
Figure 11B:
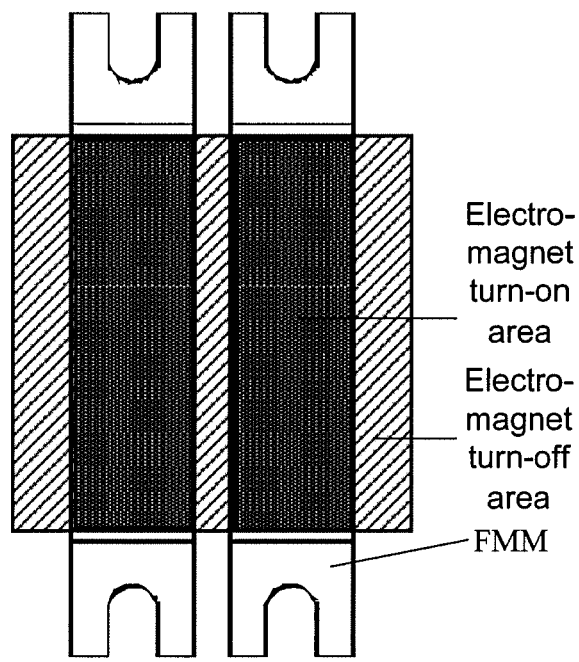
Figure 11C:
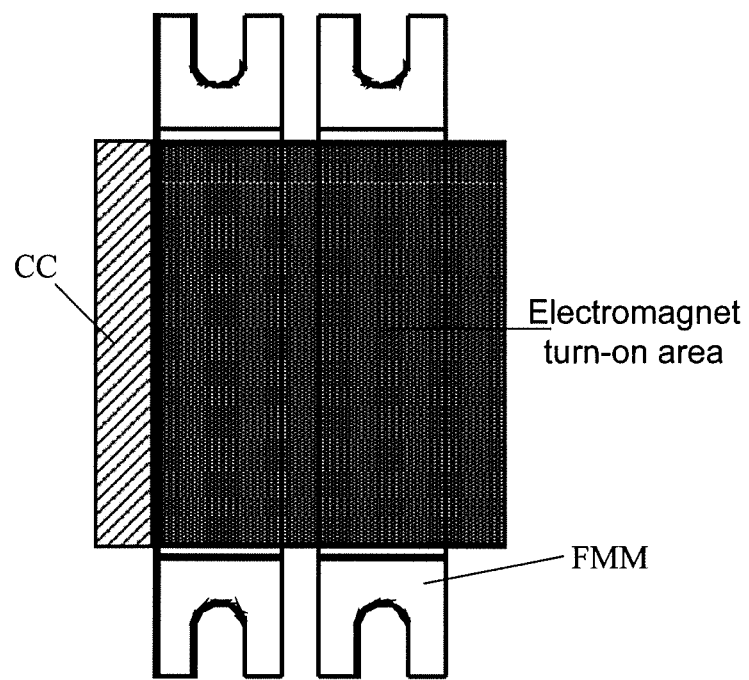
Figure 12A:
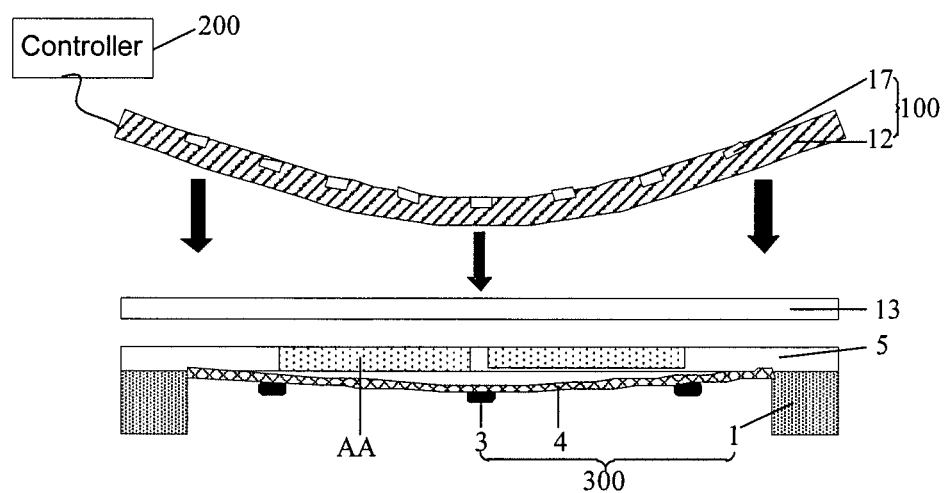
FIGS. 12a-12d are diagrams showing a process in which a mask is adsorbed according to some embodiments of the present disclosure.
Figure 12B:
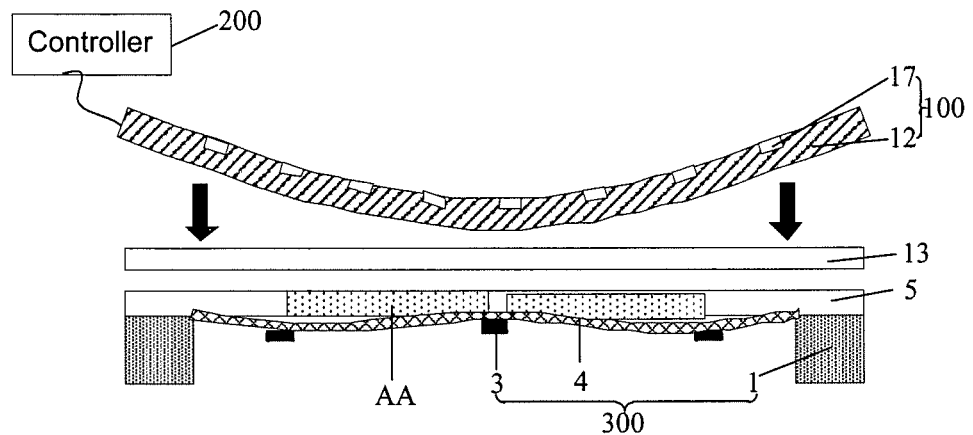
Figure 12C:
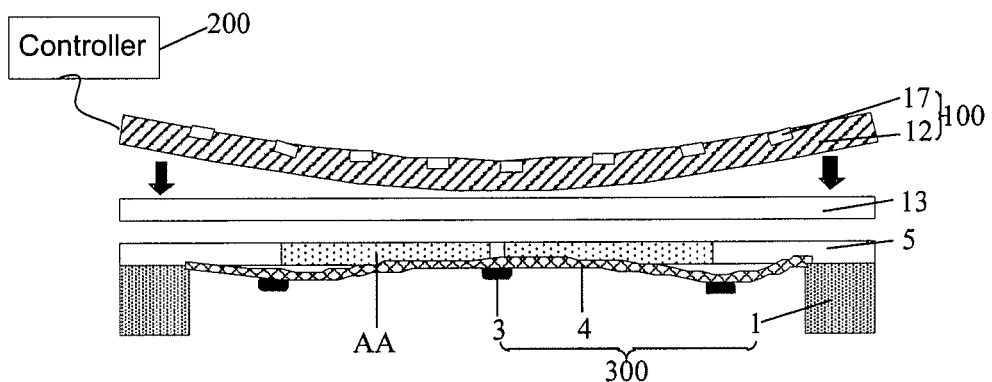
Figure 12D:
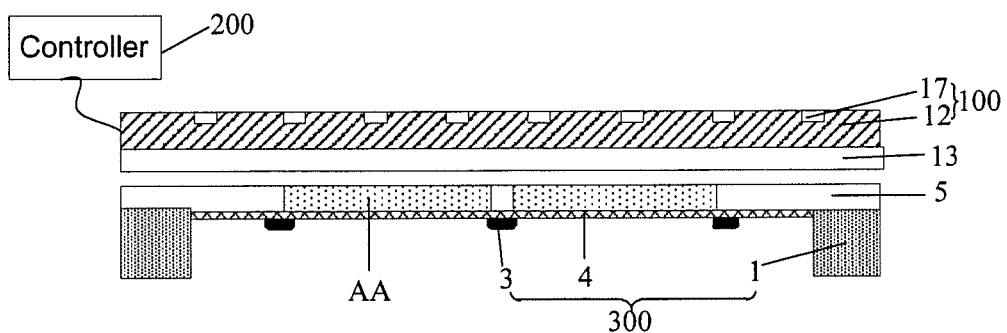
Figure 13A:
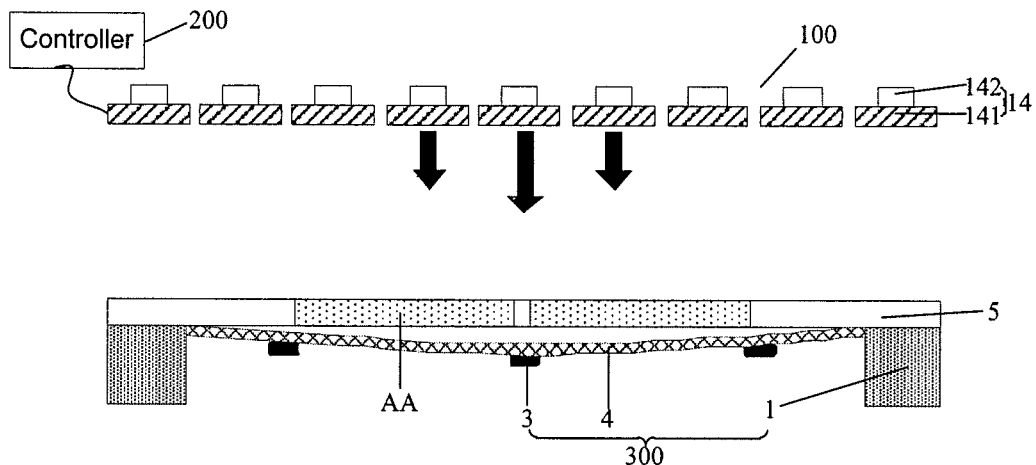
FIGS. 13a-13d are diagrams showing another process in which a mask is adsorbed according to some embodiments of the present disclosure.
Figure 13B:
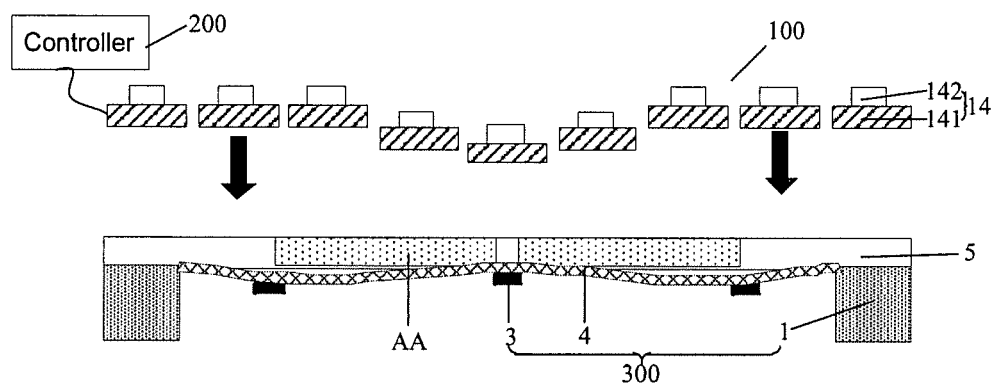
Figure 13C:
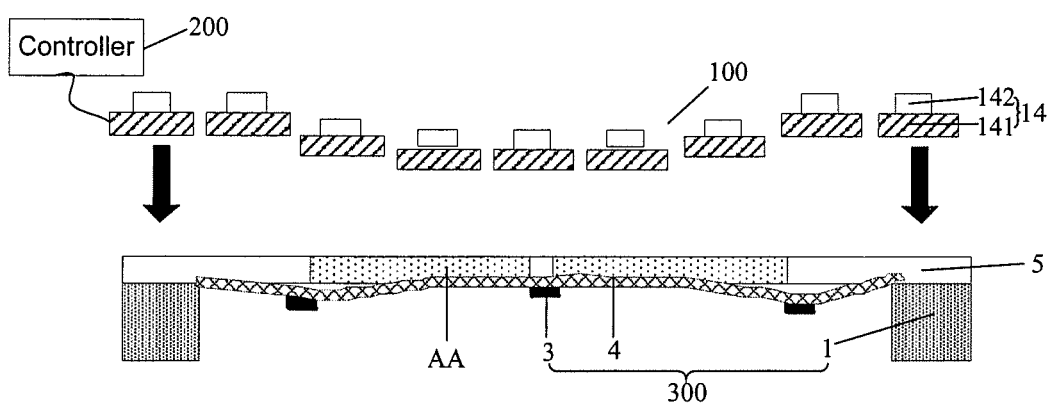
Figure 13D:
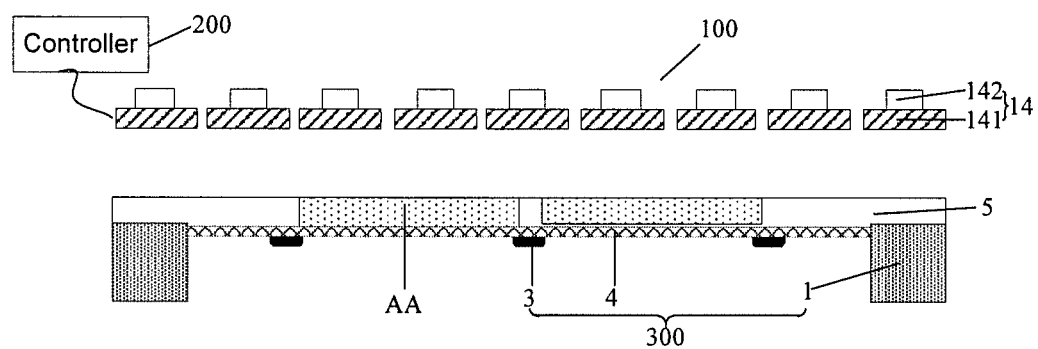
Figure 14A:
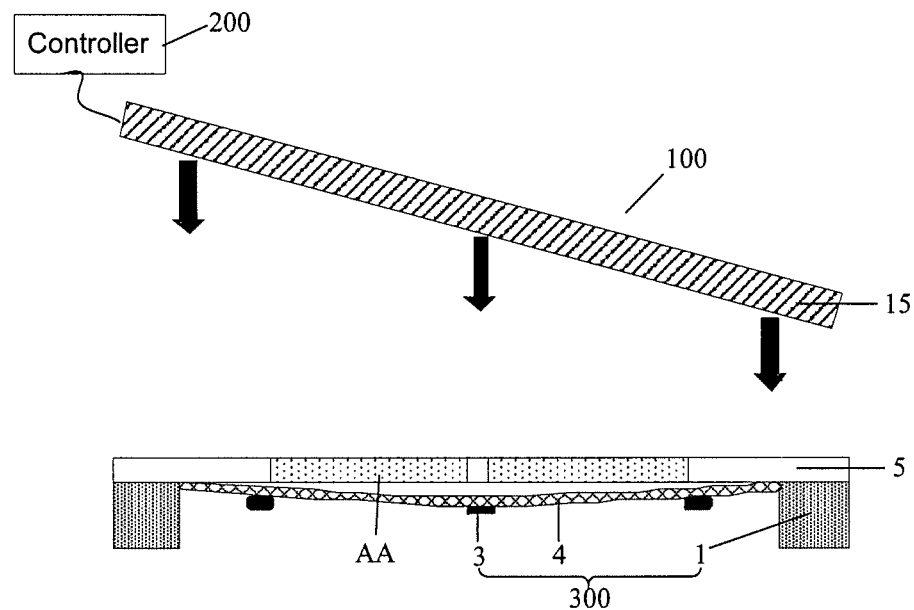
FIGS. 14a-14d are diagrams showing yet another process in which a mask is adsorbed according to some embodiments of the present disclosure.
Figure 14B:
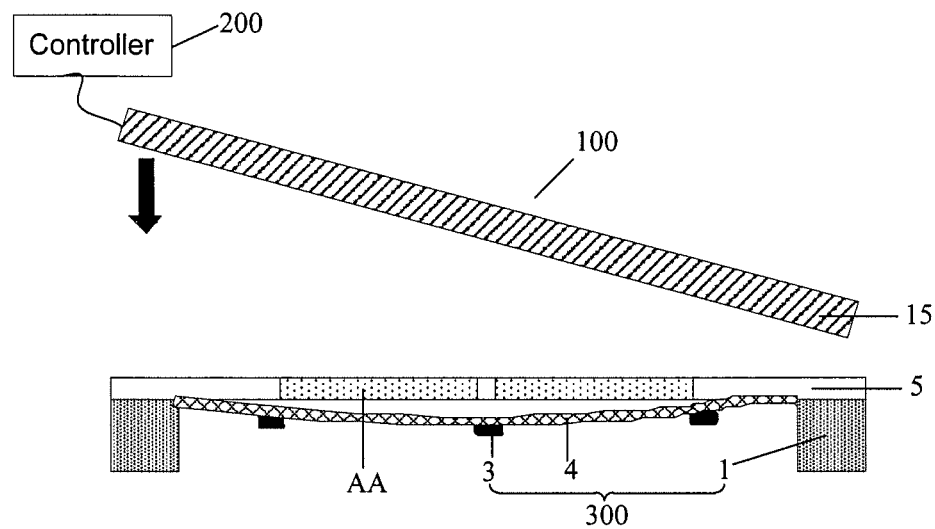
Figure 14C:
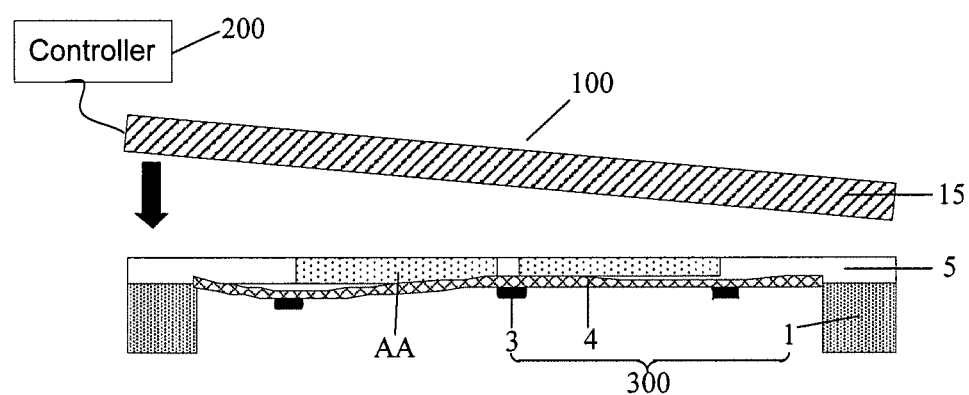
Figure 14D:
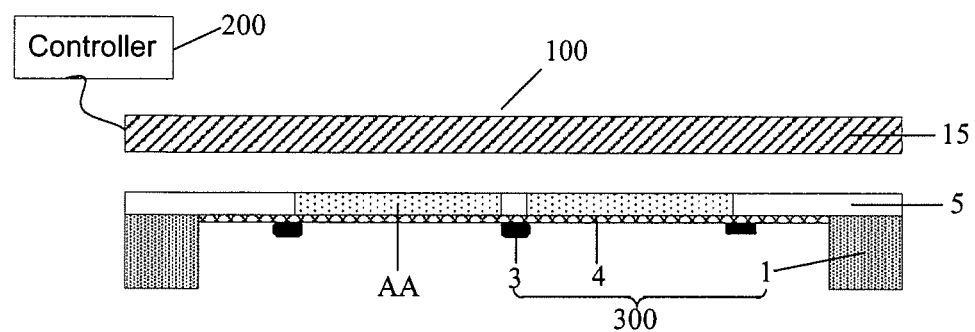

In yet some other embodiments, as shown in FIGS. 11a-11c, the at least one initial adsorption region includes edge regions each of which is disposed on one side of a corresponding FMM 4 of the mask 300. The method is similar to the method as shown in FIGS. 10a-10c, and therefore it will not be repeated herein.

It will be noted that, as shown in FIG. 11c, in the method as shown in FIGS. 11a-11c, since the electromagnets 7 are turned on in order from edge regions each of which is disposed on one side of a corresponding FMM 4 to opposite sides of the FMMs 4, the electromagnets 7 corresponding to an outer region of the initial FMM 4 (i.e., a strip-shaped region indicated by CC in the FIG. 11c, which is referred to as a remaining region) may not be turned on. In this case, it is only necessary to control the electromagnets 7 corresponding to the remaining region CC to be turned on based on the method for adsorbing the mask as shown in FIGS. 11a-11c.

It will be noted that, for different methods for adsorbing a mask, corresponding control programs are set in the controller 200 to gradually turn on the electromagnets 7 in the adsorbing member 100 in predetermined manner.

Some embodiments of the present disclosure provide an apparatus for adsorbing a mask. As shown in FIGS. 12a-12d, the adsorbing member 100 of the apparatus for adsorbing the mask includes a flexible second carrier board 12, and at least two magnets 17 dispersedly disposed on the second carrier board 12.

The second carrier board 12 is configured to carry the magnets 17, and has flexibility and is bendable. Optionally, the second carrier board 12 is bent into a U-shape or a bowl shape. The at least two magnets 17 are capable of generating the same magnetic force, so that the at least two magnets 17 are capable of generating a relatively uniform adsorption force for the mask 300 when adsorbing the entire mask 300. In some examples, each of the at least two magnets 17 is a permanent magnet, so as to simplify a structure of the adsorbing member 100 and a process of controlling the adsorbing member 100. In some other examples, each of the at least two magnets 17 is an electromagnet, so that it is easier to control the magnets 17 to be turned on and turned off, and control the magnitude of the magnetic force. As a result, a magnetic force generated by respective regions of the adsorbing member 100 is able to change more flexibly.

In the adsorbing member 100 of the above apparatus for adsorbing the mask, a rigid carrier board of the conventional Gaussian plate is changed to a flexible second carrier board 12, so that by bending and deforming the second carrier board 12, a distance between different portions of the second carrier board 12 and the mask 300 may be adjusted, and thus an adsorption force of different portions of the adsorbing member 100 to corresponding regions of the mask 300 may be adjusted. With continued reference to FIGS. 12a-12d, when using the above adsorbing member 100 to adsorb the mask 300, the second carrier board 12 is bent and deformed to make a lowest portion of the second carrier board 12 relative to the base substrate 5 correspond to the at least one initial adsorption region of the mask 300, so that the at least one initial adsorption region of the mask 300 may be adsorbed first; and then a height of the lowest portion of the second carrier board 12 relative to the base substrate 5 is kept constant, and the second carrier board 12 is gradually laid down to be horizontal, so that the mask 300 is gradually adsorbed from the at least one initial adsorption region of the mask 300, until the entire mask 300 is adsorbed and attached to the base substrate 5. Since the mask is gradually adsorbed from one part to the whole, there will be fewer or no wrinkles on the FMM 4 of the mask 300. Even if wrinkles are generated, it may be designed in a way that a key area of the FMM 4 (the key area is for example a display area AA of the FMM 4) is adsorbed first, so that the wrinkles may be moved outside the key area of the FMM 4, thereby avoiding display defects caused by wrinkling in the display area AA of the FMM 4.

During the adsorption process, there are various ways to control the second carrier board 12 to change from a curved state to a horizontal state.

In some embodiments, the adsorbing member 100 further includes at least two components, such as at least two suction cups or at least two suction nozzles, of which heights are independently controllable. These components adsorb at least two points of the second carrier board 12, so that the second carrier 12 may be switched between a curved state and a horizontal state by adjusting the heights of the components. In this way, since the heights of respective regions of the second carrier board 12 can be controlled by corresponding suction cups or suction nozzles through adsorption, a shape deformation of the second carrier board 12 is more flexible.

In some other embodiments, with continued reference to FIGS. 12a-12d, the apparatus for adsorbing the mask includes a rigid flat plate 13 disposed between the second carrier board 12 and the base substrate 5. The rigid flat plate 13 is not magnetic and is configured to support the second carrier board 12 when the mask 300 is being adsorbed. For example, during the process of adsorbing the mask 300, the second carrier board 12 is bent and deformed, and then gradually lowered until the second carrier board 12 is completely placed on the rigid flat plate 13. During this process, the lowest portion of the second carrier board 12 relative to the base substrate 5 contacts the rigid flat plate 13 first, and then the entire second carrier board 12 makes contact with the rigid flat plate 13 starting from the lowest portion to remaining portions. Thereby, an adsorption process starting from the at least one initial adsorption region of the mask 300 to the entire mask 300 is completed.

Based on the apparatus for adsorbing the mask provided by the above embodiments, a method for adsorbing a mask using the apparatus will be exemplarily described below.

In some embodiments, as shown in FIGS. 8a-8c, the at least one initial adsorption region is a bisector region of the mask 300, and the method includes the following steps: clamping two ends of the second carrier board 12 to cause the second carrier board 12 to sag naturally in a U-shape and cause a sagging portion of the second carrier board 12 (in this case, a middle region) to directly face the at least one initial adsorption region; controlling the second carrier board 12 to gradually descend while maintaining in that state; maintaining a height of the middle region of the second carrier board 12 after the initial adsorption region is attached to the base substrate 5; and then controlling the clamped two ends of the second carrier board 12 to be gradually lowered until the entire second carrier board 12 is in a horizontal state. At this time, the at least two magnets 17 produce the same magnetic force, and the adsorbing member 100 applies a uniform adsorption force to the entire mask 300, so that the entire mask 300 is adsorbed and attached to the base substrate 5.

In some other embodiments, as shown in FIGS. 10a-10c, the at least one initial adsorption region is an edge region on one side of the mask 300, and the method includes the following steps: clamping two ends of the second carrier board 12 to cause the second carrier board 12 to be inclined and cause a lower end of the second carrier board 12 to face the at least one initial adsorption region; controlling the second carrier board 12 to gradually descend while maintaining in that state; maintaining a height of a lower end of the second carrier board 12 after the initial adsorption region is attached to the base substrate 5; and then controlling a higher end of the second carrier board 12 to be gradually lowered, until the entire second carrier board 12 is in a horizontal state. At this time, the at least two magnets 17 produce the same magnetic force, and the adsorbing member 100 applies a uniform adsorption force to the entire mask 300, so that the entire mask 300 is adsorbed and attached to the base substrate 5.

In yet some other embodiments, as shown in FIGS. 6a-6c, the initial adsorption region is a central region of the mask 300, and the method includes the following steps: clamping four sides of the second carrier board 12 to cause the second carrier board 12 to sag naturally in a bowl shape and cause a sagging portion of the second carrier board 12 (in this case, a central region) to face the initial adsorption region; controlling the second carrier board 12 to gradually descend while maintaining in that state; maintaining a height of the central region of the second carrier board 12 after the initial adsorption region is attached to the base substrate 5; and then controlling the clamped four sides of the second carrier board 12 to be gradually lowered, until the entire second carrier board 12 is in a horizontal state. At this time, the at least two magnets 17 produce the same magnetic force, and the adsorbing member 100 applies a uniform adsorption force to the entire mask 300, so that the entire mask 300 is adsorbed and attached to the base substrate 5.

It will be noted that, for different methods for adsorbing the mask, corresponding control programs are set in the controller 200 to control heights and shapes of the second carrier board 12 of the adsorbing member in the predetermined manner.

Some embodiments of the present disclosure provide an apparatus for adsorbing a mask. As shown in FIGS. 13a-13d, the adsorbing member 100 of the apparatus for adsorbing the mask includes at least two Gauss units 14, and each Gauss unit 14 includes a third carrier board 141 and at least one magnet 142 disposed on the third carrier board 141.

The third carrier board 141 is, for example, in the shape of a strip, a block or a disk. In the case where the third carrier board 141 is in the shape of a strip, a length thereof is, for example, greater than or equal to a length of one side of the mask 300. At this time, the at least two Gauss units are arranged side by side in a direction perpendicular to their own length direction, so as to correspond to the entire mask 300. Alternatively, the length of the third carrier board 141 is less than the length of one side of the mask 300. For example, the length of the third carrier board 141 is a fraction of the length of one side of the mask 300. At this time, the at least two Gauss units 14 are arranged in a matrix of a plurality of rows and a plurality of columns, so as to correspond to the entire mask 300. If the third carrier board 141 is in the shape of a block or a disk, then the at least two Gauss units 14 are arranged in a matrix of a plurality of rows and a plurality of columns, so as to correspond to the entire mask 300. It will be noted that the term "block" used herein refers to a cubic shape of which a length and a width are equal or substantially equal.

The shape of the magnet 142 is, for example, a rectangular parallelepiped, a cylinder, or other shapes, which is not limited in the present disclosure. In some examples, the magnet 142 is for example a permanent magnet, so that a structure of the adsorbing member 100 and a process of controlling the adsorbing member 100 may be simplified. In some other examples, the magnet 142 is for example an electromagnet, so that it is easier to control the magnet 142 to be turned on and turned off, and control a magnitude of the magnetic force. As a result, a magnetic force generated by respective regions of the adsorbing member 100 is able to change more flexibly. The number of the magnets 142 disposed on each third carrier board 141 is variable depending on a size of the third carrier board 141 and a size of the magnet 142.

The at least two Gauss units 12 are able to be lifted and lowered independently and are capable of generating the same magnetic force, so that the at least two Gauss units 14 are capable of generating a relatively uniform adsorption force for the mask 300 when adsorbing the entire mask 300. During evaporation, the at least two Gauss units 14 respectively correspond to different regions of the mask 300, so as to adsorb the entire mask 300.

The at least two Gauss units 14 are equivalent to a plurality of independent magnetic units obtained by splitting the rigid Gaussian plate of the related art, so that heights of different Gauss units 14 are adjustable. By adjusting the heights of the Gauss units 14 in different regions relative to the base substrate 5, the magnitude of the adsorption forces to the corresponding regions of the mask 300 may be adjusted. With continued reference to FIGS. 13a-13d, when using the adsorbing member 100 to adsorb the mask 300, the Gauss units 14 corresponding to the at least one initial adsorption region of the mask 300 is controlled to descend, so that the Gauss units 14 adsorb the at least one initial adsorption region of the mask 300. Then, the Gauss units 14 corresponding to surrounding regions of the at least one initial adsorption region are gradually lowered starting from the Gauss units 14 corresponding to the at least one initial adsorption region, so as to expand an adsorption region of the mask 300, until the entire mask 300 is adsorbed and attached to the base substrate 5. Since the mask is gradually adsorbed from one part to the whole, there will be fewer or no wrinkles on the FMM 4 of the mask 300. In some examples, it is designed in a way that a key area of the FMM 4 (the key area is for example a display area AA of the FMM 4) is adsorbed first, so that wrinkles to be generated may be moved to a non-key area of the FMM 4, thereby avoiding display defects caused by wrinkling in the display area AA of the FMM 4.

Based on the apparatus for adsorbing the mask provided by the above embodiments, a method for adsorbing a mask using the apparatus will be exemplarily described below.

In some embodiments, as shown in FIGS. 8a-8c, the at least one initial adsorption region is a bisector region of the mask 300, and the method includes the following steps: controlling the Gauss units 14 corresponding to the initial adsorption region to descend; maintaining the heights of the Gauss units corresponding to the initial adsorption region after the initial adsorption region is attached to the base substrate 5; and then controlling the Gauss units 14 to descend in order from the initial adsorption region to both sides of the mask 300 in directions perpendicular to the initial adsorption region, until all of the Gauss units 14 are on the same horizontal plane. At this time, the at least two Gauss units 14 produce the same magnetic force, and the adsorbing member 100 applies a uniform adsorption force to the entire mask 300, so that the entire mask 300 is adsorbed and attached to the substrate 5.

In yet some other embodiments, as shown in FIGS. 9*a*-9*c*, the at least one initial adsorption region includes bisector regions of FMMs 4 of the mask 300. The method is similar to the method as shown in FIGS. 8*a*-8*c*, and therefore it will not be repeated herein.

In yet some other embodiments, as shown in FIGS. 10*a*-10*c*, the at least one initial adsorption region is an edge region on one side of the mask 300, and the method includes the following steps: controlling the Gauss units 14 corresponding to the initial adsorption region to descend; maintaining the heights of the Gauss units corresponding to the initial adsorption region after the initial adsorption region is attached to the base substrate 5; and then controlling the Gauss units 14 to descend in order from the initial adsorption region to another side of the mask 300 in directions perpendicular to the initial adsorption region, until all of the Gauss units 14 are on the same horizontal plane. At this time, the Gauss units 14 produces the same magnetic force, and the rigid Gaussian plate 100 applies a uniform adsorption force to the entire mask 300, so that the entire mask 300 is adsorbed and attached to the substrate 5.

In yet some other embodiments, as shown in FIGS. 11*a*-11*c*, the at least one initial adsorption region includes edge regions each of which is disposed on one side of a corresponding FMM 4 of the mask 300. The method is similar to the method as shown in FIGS. 10*a*-10*c*, and therefore it will not be repeated herein.

In some embodiments, the third carrier board 141 is in the shape of a block or a disk. Then, the initial adsorption region of the mask 100 is set to be a central region of the mask 300, or include central regions of FMMs 4 of the mask 300. The method for adsorbing a mask is shown in FIGS. 6*a*-6*c*, and 7*a*-7*c*. During the adsorption process, corresponding Gauss units 14 are controlled to descend according to a change of the adsorption region. For example, the adsorption region is gradually expanded from a central region of the mask or a central region of each FMM of the mask to the periphery, and the Gauss units 14 are controlled in the following way: controlling the Gauss units 14 corresponding to the initial adsorption region to descend, and then controlling the remaining Gauss units 14 to descend in order in directions outwardly radiating from the initial adsorption region, until all of the Gauss units 14 are on the same horizontal plane.

It will be noted that, for different methods for adsorbing a mask, corresponding control programs are set in the controller 200 to control the heights of the Gauss units 14 of the adsorbing member in a predetermined manner.

Some embodiments of the present disclosure provide a method for adsorbing a mask. As shown in FIGS. 14*a*-14*d*, the adsorbing member 100 adopted in the method includes a rigid Gaussian plate 15 having a uniform magnetic force, which means that the method adopts a conventional Gaussian plate in the related art. In the method, the initial adsorption region is an edge region on one side of the mask 300. Referring to FIGS. 10*a*-10*c*, the method includes: clamping two ends of the rigid Gaussian plate 15 to cause the rigid Gaussian plate 15 to be inclined and cause an end of the rigid Gaussian plate 15 closer to the base substrate 5 to face the initial adsorption region; controlling the rigid Gaussian plate 15 to gradually descend while maintaining in the state; maintaining a height of the end of the rigid Gaussian plate 15 closer to the base substrate 5 after the initial adsorption region is attached to the base substrate 5; and controlling an opposite end of the rigid Gaussian plate 15 farther from the base substrate 5 to be gradually lowered, until the rigid Gaussian plate 15 is in a horizontal state. At this time, the rigid Gaussian plate 15 applies a uniform adsorption force to the entire mask 300, so that the entire mask 300 is adsorbed and attached to the base substrate 5.

It will be noted that, for the above method, a corresponding control program is set in the controller 200 to control heights of the clamped two ends of the rigid Gaussian plate 15 in a predetermined manner.

Figure 18:
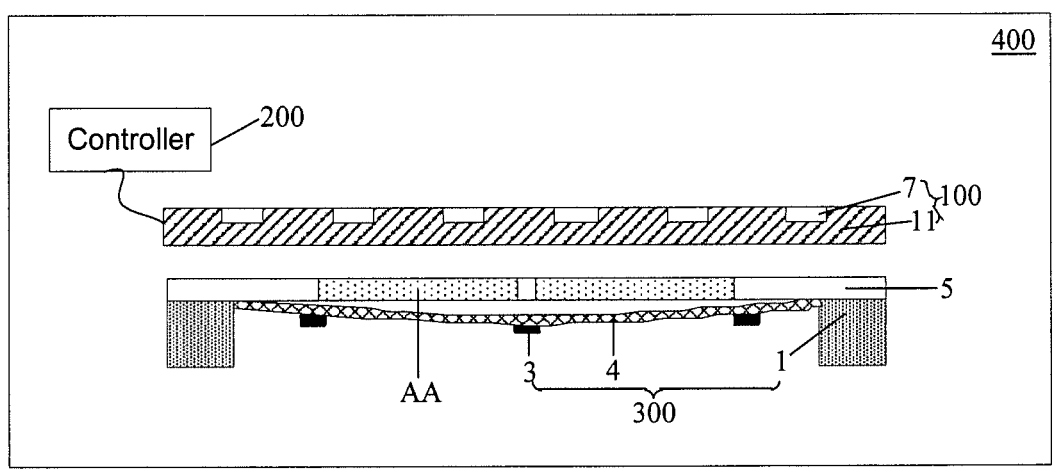
FIG. 18 is a structural diagram of an evaporation device according to some embodiments of the present disclosure.

Based on the apparatus for adsorbing the mask provided by the embodiments of the present disclosure, some embodiments of the present disclosure provide an evaporation device. As shown in FIG. 18, the evaporation device 400 includes the apparatus for adsorbing the mask provided by the embodiments of the present disclosure. The apparatus for adsorbing the mask is installed in a vacuum evaporation chamber of the evaporation device 400, so as to perform evaporation after the mask 300 is adsorbed to be attached to the base substrate 5.

Some embodiments of the present disclosure provide an evaporation method, which includes: adsorbing the mask 300 using the method for adsorbing the mask provided by the embodiments of the present disclosure to attach the mask 300 to the base substrate 5. After that, the base substrate 5 is evaporated.

The evaporation device and evaporation method provided by the embodiments of the present disclosure have the same advantageous effects as the apparatus and method for adsorbing the mask provided by the embodiments of the present disclosure, and details will not be described herein again.

The controller described in the above embodiments is executed, for example, by a microprocessor programmed to perform one or more of the operations and/or functions described herein. Alternatively, the controller is implemented in whole or in part by specially configured hardware (e.g., by one or more application-specific integrated circuits (ASIC(s))).

As can be seen from the apparatus and method for adsorbing the mask provided by the embodiments of the present disclosure, since the adsorption is started from at least one initial adsorption region of the mask 300, and then the adsorption range is gradually expanded from the at least one initial adsorption region during the process of adsorbing the mask 300, a region in the mask 300 where wrinkles are expected to be generated may be estimated. The wrinkles may be generated in a last region of the mask 300 to be attached to the base substrate 5. As shown in FIGS. 15*a*, 15*b*, 16, and 17, since the wrinkles can be moved to a non-display area DD of the FMM 4 by a method in which the mask is adsorbed from one part to the whole, it is estimated that the region BB where wrinkles are expected to be generated is located at the non-display area DD of the FMM 4, for example, an edge region on one side of the mask 300, or an edge region on one side of each FMM 4 of the mask 300.

Based on the above conclusions, the region BB where wrinkles are expected to be generated in the FMM 4 of the mask 300 can be designed in a certain way. In some embodiments, an FMM 4 is provided in which the region BB where wrinkles are expected to be generated is thickened, that is, the thickness of the region BB where wrinkles are expected to be generated is greater than the thickness of remaining regions. Through such a design, a deformation resistance of the region BB where wrinkles are expected to be generated in the FMM 4 can be enhanced, thereby avoiding wrinkling in the region BB where wrinkles are expected to be generated. Consequently, the quality of an evaporated film is improved, further enhancing protection of the mask.

It will be noted that a degree to which the region BB where wrinkles are expected to be generated will be thickened is not particularly limited in the embodiments of the present disclosure, as long as the deformation resistance of the region BB where wrinkles are expected to be generated can be increased.

Figure 15A:
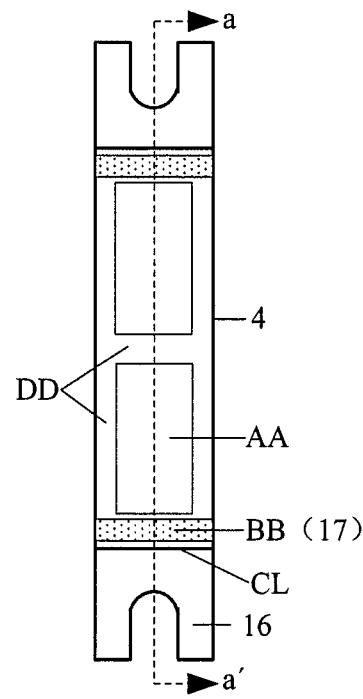
FIGS. 15a and 15b are structural diagrams of an FMM according to some embodiments of the present disclosure.
Figure 15B:
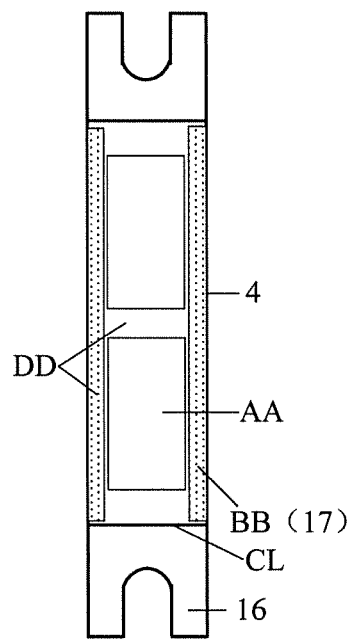
Figure 16:
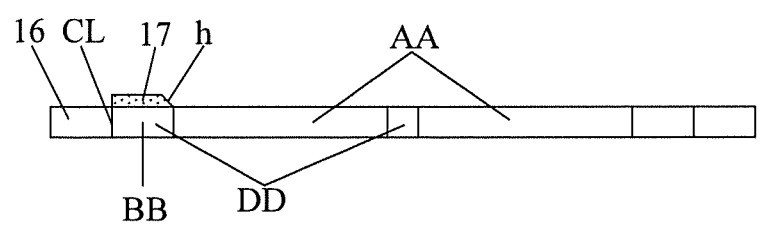
FIG. 16 is a cross-sectional view of the structure of FIG. 15a along line aa'.

In some embodiments, as shown in FIGS. 15*a*, 15*b*, and 16, a pattern 17 having a certain thickness is provided on the region BB where wrinkles are expected to be generated, so that the thickness of the region BB where wrinkles are expected to be generated is greater than the thickness of the remaining regions.

The thickness and shape of the pattern 17 to be provided is not particularly limited in the embodiments of the present disclosure, as long as the deformation resistance of the region BB where wrinkles are expected to be generated can be increased.

In some embodiments, as shown in FIG. 16, a sidewall h of the pattern 17 has a certain slope. This allows the thickness of the FMM 4 to smoothly transition from thin to thick, avoiding bending or wrinkling that may be caused by sudden changes in the thickness of the FMM 4.

Figure 17:
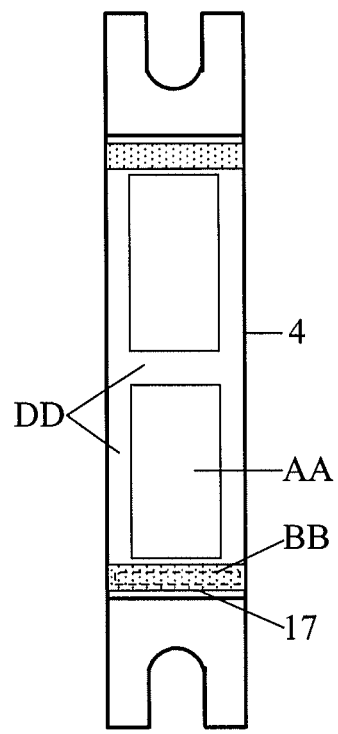
FIG. 17 is a structural diagram of another FMM according to some embodiments of the present disclosure.

In some embodiments, as shown in FIG. 15*a*, an area of a region covered by the pattern 17 is equal to an area of the region BB where wrinkles are expected to be generated. In some other embodiments, as shown in FIG. 17, the area of the region covered by the pattern 17 is larger than the area of the region BB where wrinkles are expected to be generated, so that the deformation resistance of the region BB where wrinkles are expected to be generated may be further enhanced.

As for the manner in which the pattern 17 is formed, it may be integrally formed with the main body of the FMM 4; or the pattern can be attached to the main body of the FMM 4 in the form of bonding, welding, electroplating, or evaporation, which is not limited in this embodiment.

In addition, in FIGS. 15*a*, 15*b*, 16, and 17, CL represents a cutting line, and a U-shaped portion on an outer side of the cutting line CL (of two sides of the cutting line CL, a side where the display area AA is located is an inner side, and another side is the outer side) is a clamping portion 16. The clamping portion 16 is configured to facilitate clamping of the FMM 4, making it more convenient to weld the FMM 4 to the metal frame of the mask during the manufacture of the mask by clamping the clamping portion 16. After the welding is completed, the clamping portions 16 at both ends of the FMM 4 may be cut along the cutting lines CL.

Based on the FMM described above, some embodiments of the present disclosure provide a mask, which includes at least one FMM provided by the embodiments of the present disclosure. The mask has the same advantageous effects as the FMM provided by the embodiments of the present disclosure, and details will not be described herein again.

The foregoing descriptions are merely some implementation manner of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. An apparatus for adsorbing a mask, the apparatus comprising:
    an adsorbing member configured to adsorb the mask during evaporation and capable of simultaneously producing different or a same adsorption force to different regions of the mask; and
    a controller connected to the adsorbing member, wherein the controller is configured to control the adsorbing member to start adsorption from at least one initial adsorption region of the mask, and then control the adsorbing member to gradually expand an adsorption range from the at least one initial adsorption region until the mask is entirely attached to a base substrate;
    wherein the adsorbing member comprises:
    a first carrier board;
    at least two electromagnets dispersedly disposed on the first carrier board, the at least two electromagnets capable of simultaneously generating a same magnetic force and each of the at least two electromagnets comprising an iron core and a coil wound around the iron core; and
    at least two switches, each switch being connected to at least one of the at least two electromagnets.

2. The apparatus for adsorbing the mask according to claim 1, wherein the adsorbing member further comprises at least two variable resistors, and each resistor is connected to at least one of the at least two electromagnets.

3. The apparatus for adsorbing the mask according to claim 2, wherein the at least two electromagnets, the at least two switches, and the at least two variable resistors are connected in series in one-to-one correspondence to form a plurality of branches that are connected in parallel.

4. The apparatus for adsorbing the mask according to claim 1, wherein the iron core is a cylinder, and the at least two electromagnets are vertically arranged on the first carrier board in an array, or vertically arranged on the first carrier board in at least two concentric rings; or
    the iron core is a square cylinder, and the at least two electromagnets are horizontally arranged on the first carrier board in an array.

5. The apparatus for adsorbing the mask according to claim 4, wherein a gap between two adjacent electromagnets of the at least two electromagnets is less than or equal to a width of a region of the mask where wrinkles are expected to be generated;
    the iron core is a cylinder having a diameter less than or equal to the width of the region of the mask where wrinkles are expected to be generated; or the iron core is a square cylinder having a width less than or equal to the width of the region of the mask where wrinkles are expected to be generated.

6. A method for adsorbing a mask for use in the apparatus for adsorbing the mask according to claim 1, the method comprising:
    starting adsorption from at least one initial adsorption region of the mask, and then gradually expanding an adsorption range from the at least one initial adsorption region until the mask is entirely attached to the base substrate; wherein
    the at least one initial adsorption region comprises central regions of FMMs of the mask, and the method comprises: turning on the at least two electromagnets in order in directions outwardly radiating from the at least one initial adsorption region.

7. An evaporation method, comprising: adsorbing a mask using the method for adsorbing the mask according to claim 6 to attach the ask to the base substrate.

8. An evaporation device, comprising the apparatus for adsorbing the mask according to claim 1.

9. A method for adsorbing a mask for use in the apparatus for adsorbing the mask according to claim 1, the method comprising:
  starting adsorption from at least one initial adsorption region of the mask, and then gradually expanding an adsorption range from the at least one initial adsorption region until the mask is entirely attached to the base substrate; wherein
  the at least one initial adsorption region is a central region of the mask, and the method comprises: turning on the at least two electromagnets in order in directions outwardly radiating from the at least one initial adsorption region.

10. An evaporation method, comprising:
  adsorbing a mask using the method for adsorbing the mask according to claim 9 to attach the mask to the base substrate.

11. A method for adsorbing a mask for use in the apparatus for adsorbing the mask according to claim 1, the method comprising:
  starting adsorption from at least one initial adsorption region of the mask, and then gradually expanding an adsorption range from the at least one initial adsorption region until the mask is entirely attached to the base substrate; wherein
  the at least one initial adsorption region is a bisector region of the mask or comprises bisector regions of FMMs of the mask, and the method comprises: turning on the at least two electromagnets in order from the initial adsorption region to both sides of the mask or both sides of each FMM of the mask in directions perpendicular to the initial adsorption region, wherein the bisector region is parallel to a length direction of the FMMs or perpendicular to the length direction of the FMMs; or
  the at least one initial adsorption region is an edge region on one side of the mask or comprises edge regions each of which is disposed on one side of a corresponding FMM of the mask, and the method comprises: turning on the at least two electromagnets in order from the at least one initial adsorption region to another side of the mask or another sides of the FMMs of the mask in directions perpendicular to the initial adsorption region.

12. An evaporation method, comprising: adsorbing a mask using the method for adsorbing the mask according to claim 11 to attach the mask to the base substrate.

13. An apparatus for adsorbing a mask, the apparatus comprising:
  an adsorbing member configured to adsorb the mask during evaporation and capable of simultaneously producing different or a same adsorption force to different regions of the mask; and
  a controller connected to the adsorbing member, wherein the controller is configured to control the adsorbing member to start adsorption from at least one initial adsorption region of the mask, and then control the adsorbing member to gradually expand an adsorption range from the at least one initial adsorption region until the mask is entirely attached to a base substrate;
  wherein the adsorbing member comprises at least two Gauss units, and each Gauss unit comprises a third carrier board and at least one magnet disposed on the third carrier board;
  the at least two Gauss units are able to be lifted and lowered independently, and are capable of simultaneously generating a same magnetic force.

14. A method for adsorbing a mask for use in the apparatus for adsorbing the mask according to claim 13, the method comprising:
  starting adsorption from at least one initial adsorption region of the mask, and then gradually expanding an adsorption range from the at least one initial adsorption region until the mask is entirely attached to the base substrate; wherein
  the at least one initial adsorption region comprises central regions of FMMs of the mask, and the method comprises: controlling the at least two Gauss units to descend in order in directions outwardly radiating from the at least one initial adsorption region, until all of the at least two Gauss units are on a same horizontal plane.

15. An evaporation method, comprising: adsorbing a mask using the method for adsorbing the mask according to claim 14 to attach the mask to the base substrate.

16. A method for adsorbing a mask for use in the apparatus for adsorbing the mask according to claim 13, the method comprising:
  starting adsorption from at least one initial adsorption region of the mask, and then gradually expanding an adsorption range from the at least one initial adsorption region until the mask is entirely attached to the base substrate; wherein
  the at least one initial adsorption region is a central region of the mask, and the method comprises: controlling the at least two Gauss units to descend in order in directions outwardly radiating from the at least one initial adsorption region, until all of the at least two Gauss units are on a same horizontal plane.

17. An evaporation method, comprising: adsorbing a mask using the method for adsorbing mask according to claim 16 to attach the mask to the base substrate.

18. A method for adsorbing a mask for use in the apparatus for adsorbing the mask according to claim 13, the method comprising:
  starting adsorption from at least one initial adsorption region of the mask, and then gradually expanding an adsorption range from the at least one initial adsorption region until the mask is entirely attached to the base substrate; wherein
  the at least one initial adsorption region is a bisector region of the mask or comprises bisector regions of FMMs of the mask, and the method comprises: controlling the at least two Gauss units to descend in order from the initial adsorption region to both sides of the mask or both sides of each FMM of the mask in directions perpendicular to the initial adsorption region, until all of the at least two Gauss units are on the same horizontal plane, wherein the bisector region is parallel to a length direction of the FMMs or perpendicular to the length direction of the FMMs; or
  the at least one initial adsorption region is an edge region on one side of the mask or comprises edge regions each of which is disposed on one side of a corresponding FMM of the mask, and the method comprises: controlling the at least two Gauss units to descend in order from the at least one initial adsorption region to another side of the mask or another sides of FMMs of the mask in directions perpendicular to the initial adsorption region, until all of the Gauss units are on the same horizontal plane.

19. An evaporation method, comprising: adsorbing a mask using the method for adsorbing the mask according to claim 18 to attach the mask to the base substrate.

20. An evaporation device, comprising the apparatus for adsorbing the mask according to claim 13.

* * * * *

UNITED STATES PATENT AND TRADEMARK OFFICE
CERTIFICATE OF CORRECTION

PATENT NO. : 11,136,662 B2
APPLICATION NO. : 16/135816
DATED : October 5, 2021
INVENTOR(S) : Chang Luo et al.

It is certified that error appears in the above-identified patent and that said Letters Patent is hereby corrected as shown below:

In the Claims

Column 18 Claim 7 should read:
7. An evaporation method, comprising: adsorbing a mask using the method for adsorbing the mask according to claim 6 to attach the mask to the base substrate.

Column 20 Claim 17 should read:
17. An evaporation method, comprising: adsorbing a mask using the method for adsorbing the mask according to claim 16 to attach the mask to the base substrate.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*